US008932933B2

(12) United States Patent
Laboriante et al.

(10) Patent No.: US 8,932,933 B2
(45) Date of Patent: Jan. 13, 2015

(54) METHODS OF FORMING HYDROPHOBIC SURFACES ON SEMICONDUCTOR DEVICE STRUCTURES, METHODS OF FORMING SEMICONDUCTOR DEVICE STRUCTURES, AND SEMICONDUCTOR DEVICE STRUCTURES

(75) Inventors: Ian C. Laboriante, Boise, ID (US); Prashant Raghu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/464,645

(22) Filed: May 4, 2012

(65) Prior Publication Data
US 2013/0292647 A1  Nov. 7, 2013

(51) Int. Cl.
H01L 21/8242 (2006.01)
H01L 21/302 (2006.01)
H01L 21/461 (2006.01)

(52) U.S. Cl.
USPC ........... 438/387; 438/253; 438/396; 438/244; 427/255.6; 257/E21.648; 257/E21.019; 257/E27.089; 106/14.05

(58) Field of Classification Search
USPC .......... 438/780, 387, 253, 396, 244; 257/E21.648, E21.019, E27.089; 106/14.05; 427/255.6
See application file for complete search history.

(56) References Cited

U.S. PATENT DOCUMENTS

| | | | |
|---|---|---|---|
| 6,558,796 B2 | 5/2003 | Huybrechts et al. | |
| 6,645,644 B1 | 11/2003 | Schwartz et al. | |
| 6,767,587 B1 | 7/2004 | Brown | |
| 7,125,781 B2 | 10/2006 | Manning et al. | |
| 7,309,902 B2 | 12/2007 | Reboa | |
| 7,883,738 B2* | 2/2011 | Abys et al. | 427/58 |
| 7,892,937 B2* | 2/2011 | Rana et al. | 438/396 |
| 2003/0186914 A1* | 10/2003 | Hofer et al. | 514/44 |
| 2005/0054159 A1* | 3/2005 | Manning et al. | 438/253 |
| 2008/0131709 A1* | 6/2008 | Hanson et al. | 428/457 |
| 2009/0324834 A1* | 12/2009 | Hanson | 427/327 |
| 2010/0099232 A1* | 4/2010 | Rana et al. | 438/396 |
| 2011/0143543 A1 | 6/2011 | Rana et al. | |
| 2011/0189858 A1* | 8/2011 | Yasseri et al. | 438/694 |

OTHER PUBLICATIONS

Microsurfaces, Inc., Anti-Stiction Coatings in MEMS Devices, http://www.memsurface.com/stiction.html, visited Feb. 9, 2012, 2 pages.

* cited by examiner

Primary Examiner — Su Kim
Assistant Examiner — Regan J Rundio
(74) Attorney, Agent, or Firm — TraskBritt

(57) ABSTRACT

A method of forming a hydrophobic surface on a semiconductor device structure. The method comprises forming at least one structure having at least one exposed surface comprising titanium atoms. The at least one exposed surface of at least one structure is contacted with at least one of an organo-phosphonic acid and an organo-phosphoric acid to form a material having a hydrophobic surface on the at least one exposed surface of the least one structure. A method of forming a semiconductor device structure and a semiconductor device structure are also described.

27 Claims, 17 Drawing Sheets

METHODS OF FORMING HYDROPHOBIC SURFACES ON SEMICONDUCTOR DEVICE STRUCTURES, METHODS OF FORMING SEMICONDUCTOR DEVICE STRUCTURES, AND SEMICONDUCTOR DEVICE STRUCTURES

TECHNICAL FIELD

Embodiments of the disclosure relate to the field of semiconductor device design and fabrication. More specifically, the disclosure, in various embodiments, relates to methods of forming hydrophobic surfaces on semiconductor device structures, methods of forming semiconductor device structures, and to semiconductor device structures.

BACKGROUND

A continuing goal of integrated circuit fabrication is to increase integration density. One approach used to achieve increased integration density involves reducing the lateral footprint of individual structures by increasing the aspect ratio (i.e., ratio of height to width or diameter) of the individual structures and the proximity of adjacent structures. However, one problem with this approach is that spaces between closely adjacent high aspect ratio (HAR) structures can act as capillaries during post-formation processes (e.g., "release-related" processes such as cleaning, rinsing, and drying, and "in-use" processes such as post-drying processes), such that liquid (e.g., water) is drawn into such spaces. High surface tension forces resulting from the liquid in the spaces between adjacent HAR structures can cause the adjacent HAR structures to topple or collapse toward each other, bringing the adjacent HAR structures into contact with each other. The gap between the adjacent HAR structures can produce surface forces (e.g., Van der Waals, electrostatic, hydrogen bonding, capillary, solid bridging, etc.) that cause the adjacent HAR structures to statically adhere to each other. Such static adhesion is commonly referred to in the art as "stiction." Stiction between the adjacent HAR structures can substantially impede desired functions of a semiconductor device structure or even render the semiconductor device structure inoperable (e.g., by substantially damaging components of the semiconductor device structure).

A need, therefore, exists for new, simple, and cost-efficient methods of reducing stiction between adjacent HAR structures of a semiconductor device structure. It would be further desirable for the new methods to be applicable to the formation of a variety of semiconductor device structures.

DETAILED DESCRIPTION

Figure 1A:
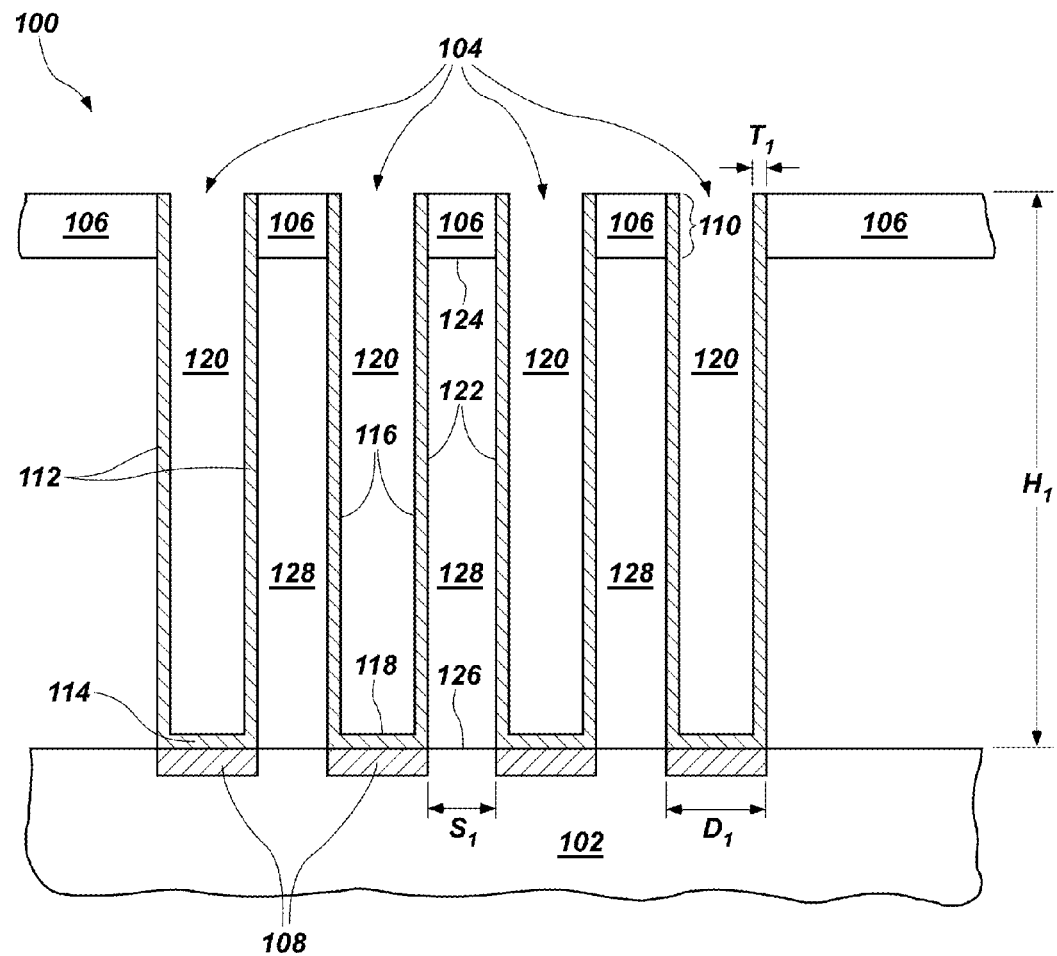
FIGS. 1A through 1D are partial cross-sectional views of a semiconductor device structure and illustrate various stages of a method of forming a plurality of capacitors in accordance with embodiments of the disclosure.

Semiconductor device structures including at least one hydrophobic surface are disclosed, as are methods of forming such structures and devices. The hydrophobic surface may be formed by exposing at least one structure having titanium exposed on a surface thereof with a plurality of precursor compounds to form a hydrophobic material on the at least one structure. By modifying the exposed surface of the at least one structure, the surface of the at least one structure may become hydrophobic. Each of the plurality of precursor compounds includes a reactive head group (e.g., a phosphonate group, or a phosphate group) that may react with and attach to a titanium atom of the at least one structure, and a hydrophobic tail group (e.g., a hydrocarbon group) that may form a portion of the hydrophobic surface. The hydrophobic material may be used as at least one of an anti-stiction material, a passivation material, and a lubricant for the at least one structure. As used herein, the term "anti-stiction material" means and includes a material that substantially limits or even prevents adhesion of adjacent structures by effecting at least one of forces resulting in the contact of the adjacent structures (e.g., adhesion forces between the adjacent structures and a liquid moving between the adjacent structures) and forces adhering the adjacent structures to each other upon contact. For example, the hydrophobic material may decrease the surface energy of adjacent structures of plurality of structures to substantially reduce surface forces which may otherwise result in contact and adhesion of the adjacent structures. The hydrophobic material may be incorporated into a semiconductor device structure, such as a dynamic random access memory (DRAM) structure, a NAND structure, and a microelectromechanical system (MEMS) structure.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details.

Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from semiconductor device structures may be performed by conventional fabrication techniques. Also note, any drawings accompanying the present application are for illustrative purposes only, and are thus not drawn to scale. Additionally, elements common between figures may retain the same numerical designation.

As used herein, relational terms, such as "first," "second," "top," "bottom," "upper," "lower," "over," "under," etc., are used for clarity and convenience in understanding the disclosure and accompanying drawings and does not connote or depend on any specific preference, orientation, or order, except where the context clearly indicates otherwise.

FIGS. 1A through 1D, are simplified partial cross-sectional views illustrating embodiments of a method of forming a semiconductor device structure that includes forming hydrophobic surfaces on a plurality of structures. With the description as provided below, it will be readily apparent to one of ordinary skill in the art that the methods described herein may be used in various applications. In other words, the methods of the disclosure may be used whenever it is desired to increase the hydrophobicity and/or reduce the surface energy of at least a portion of at least one structure.

Referring to FIG. 1A, a semiconductor device structure 100 may include a substrate 102, a plurality of structures 104, and a retaining structure 106. The plurality of structures 104 may be located in, on, or over the substrate 102. As used herein, the term "substrate" means and includes a base material or construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped. As depicted in FIG. 1A, in one or more embodiments, electrically conductive structures 108 may be located between the substrate 102 and the plurality of structures 104. The electrically conductive structures 108 may be, for example, at least one of doped regions of the substrate 102 and pedestals of a conductive material (e.g., a conductive metal material) located in, on, or over the substrate 102.

The retaining structure 106 (also referred to as a "lattice structure") may be located over at least a portion of each of the plurality of structures 104, such as over an upper region 110 of sidewalls 112 of each of the plurality of structures 104. The retaining structure 106 may be configured to provide structural support to each of the plurality of structures 104. By way of non-limiting example, the retaining structure 106 may substantially limit or prevent at least one of toppling, collapse, and wobbling of each of the plurality of structures 104.

The retaining structure 106 may include a plurality of holes or vias facilitating access to spaces between adjacent structures of the plurality of structures 104. The retaining structure 106 may have any desired thickness, such as a thickness within a range of from about 50 Å to about 3000 Å, or from about 50 Å to about 1000 Å. The retaining structure 106 may be substantially homogeneous (e.g., formed of and including a single, substantially uniform material composition), or may be substantially heterogeneous (e.g., formed of and including at least one of a non-uniform material composition, and a plurality of material compositions). The retaining structure 106 may be formed of and include at least one of silicon nitride (SiN) and a silicon oxide. In at least some embodiments, the retaining structure is formed of and includes SiN. While in FIG. 1A it may appear as though retaining structure 106 is floating, the retaining structure 106 is supported by regions of the semiconductor device structure 100 that are not visible in the cross-section shown in FIG. 1A. Such supporting regions may be analogous to those shown and described in U.S. Patent Publication No. 2005/0054159, now U.S. Pat No. 7,125,781, issued Oct. 2006.

As shown in FIG. 1A, each of the plurality of structures 104 may be a container-shaped structure, including a sidewall or sidewalls 112 integral with a floor 114. For example, a cylindrical container-shaped structure may have only a single, continuous sidewall 112, while a polygonal-shaped container structure may have a plurality of sidewalls 112. Inner sidewall surfaces 116 and an upper floor surface 118 of each of the plurality of structures 104 define openings 120 bounded by the sidewall or sidewalls 112 of each of the plurality of structures 104. In additional embodiments, each of the plurality of structures 104 may be of a different shape including, but not limited to, one of a rectangular column, a cylindrical column, a dome, a pyramid, a frusto pyramid, a cone, a frusto cone, a fin, a pillar, a stud, and an irregular shape. Accordingly, each of the plurality of structures 104 may have a desired lateral cross-sectional shape including, but not limited to, an annular shape, a circular shape, a tetragonal shape (e.g., square, rectangular, trapezium, trapezoidal, parallelogram, etc.), a triangular shape, a semicircular shape, an ovular shape, and an elliptical shape. In at least some embodiments, the lateral cross-sectional shape of each of the plurality of structures 104 is substantially annular.

The dimensions of each of the plurality of structures 104 may be varied as desired. By way of non-limiting example, as shown in FIG. 1A, at least where each of the plurality of structures 104 has a container-shaped structure, a diameter $D_1$ (or width) of each of the plurality of structures 104 may be less than or equal to about 650 Angstroms (Å), such as less than or equal to about 400 Å, or less than or equal to about 200 Å. In at least some embodiments, the diameter $D_1$ of each of the plurality of structures 104 is within a range of from about 400 Å to about 650 Å. By way of additional non-limiting example, at least where each of the plurality of structures 104 has a container-shaped structure, a height $H_1$ of the plurality of structures 104 may be greater than or equal to about $1.0\times10^4$ Å, such as greater than or equal to about $1.5\times10^4$ Å, or greater than or equal to about $2.0\times10^4$ Å. In at least some embodiments, the height $H_1$ of each of the plurality of structures 104 is within a range of from about $1.0\times10^4$ Å to about $2.0\times10^4$ Å. Each of the plurality of structures 104 may be a high aspect ratio (HAR) structure. As used herein, the term "high aspect ratio structure" means and includes that the height of the structure is greater than or equal to five times a diameter, or width, of the structure (i.e., the structure has an aspect ratio of greater than or equal to 5:1). For example, an aspect ratio of each of the plurality of structures 104 may be within a range of from about 5:1 to about 100:1, such as from about 10:1 to about 50:1, or from about 20:1 to about 30:1. In addition, as shown in FIG. 1A, if each of the plurality of structures 104 has a container-shaped structure, the sidewalls 112 of each of the plurality of structures 104 may have a thickness $T_1$ within a range of from about 40 Å to about 100 Å, such as from about 55 Å to about 80 Å, or from about 60 Å to about 70 Å. In at least some embodiment, the thickness $T_1$ of each the sidewalls 112 is about 65 Å.

Each of the plurality of structures 104 may be formed of and include at least one of a titanium material, a zirconium material, and a hafnium material. By way of non-limiting example, each of the plurality of structures 104 may be formed of and include at least one of elemental titanium (Ti), titanium nitride (TiN), titanium carbide (TiC), a titanium silicide (e.g., TiSi, $TiSi_2$), a titanium oxide (e.g., TiO, $TiO_2$), a titanium alloy (e.g., an alloy including titanium and at least one of zinc, cadmium, mercury, aluminum, gallium, indium, tin, silicon, germanium, lead, arsenic, and antimony). Accordingly, each of the plurality of structures 104 may be considered to be a titanium-containing structure. The titanium material of the structures 104 is hydrophilic, thus making the structures 104 susceptible to stiction. In at least some embodiments, each of the plurality of structures 104 is formed of and includes TiN.

Each of the plurality of structures 104 may be disposed at select locations across a surface of the substrate 102. By way of non-limiting example, the plurality of structures 104 may be disposed in an ordered array over and in contact with the substrate 102. The ordered array may include a plurality of rows and a plurality of columns across the surface of the substrate 102. The plurality of rows may run in a direction substantially perpendicular to the plurality of columns. In additional embodiments, each of the plurality of structures 104 may be disposed at random locations across the surface of the substrate 102.

The plurality of structures 104 may be substantially isolated from one another, such that at least a majority of the plurality of structures 104 do not contact an adjacent structure of the plurality of structures 104. As shown FIG. 1A, in one or more embodiments, adjacent structures of the plurality of structures 104 may be separated or spaced by a distance $S_1$ of less than or equal to about 650 Å, such less than or equal to about 400 Å, or less than or equal to about 200 Å. The distance $S_1$ between the adjacent structures may be, for example, within a range of from about 200 Å to about 600 Å. As shown in FIG. 1A, at least where each of the plurality of structures 104 is a container-shaped structure, outer sidewall surfaces 122 of the adjacent structures of the plurality of structures 104, a bottom surface 124 of the retaining structure 106, and a top surface 126 of the substrate 102 may define capillaries 128 between the adjacent structures.

The semiconductor device structure 100 may be formed using conventional techniques and conventional processing equipment (not shown), which are not described in detail herein. As a non-limiting example, the semiconductor device structure 100 may be formed using techniques substantially similar to those shown and described in U.S. Patent Publication No. 2005/0054159, now U.S. Pat. No. 7,125,781, issued Oct. 24, 2006.

Following the formation of the semiconductor device structure 100, the semiconductor device structure 100 may be cleaned and rinsed using conventional techniques and processing equipment, which are not described in detail herein. By way of non-limiting example, the semiconductor device structure 100 may be exposed to an aqueous halogen acid (e.g., hydrofluoric acid), followed by exposure to tetramethylammonium hydroxide (TMAH), followed by another exposure to an aqueous halogen acid (e.g., hydrofluoric acid), followed by at least one rinse with one or more of deionized water and isopropanol.

Figure 1B:
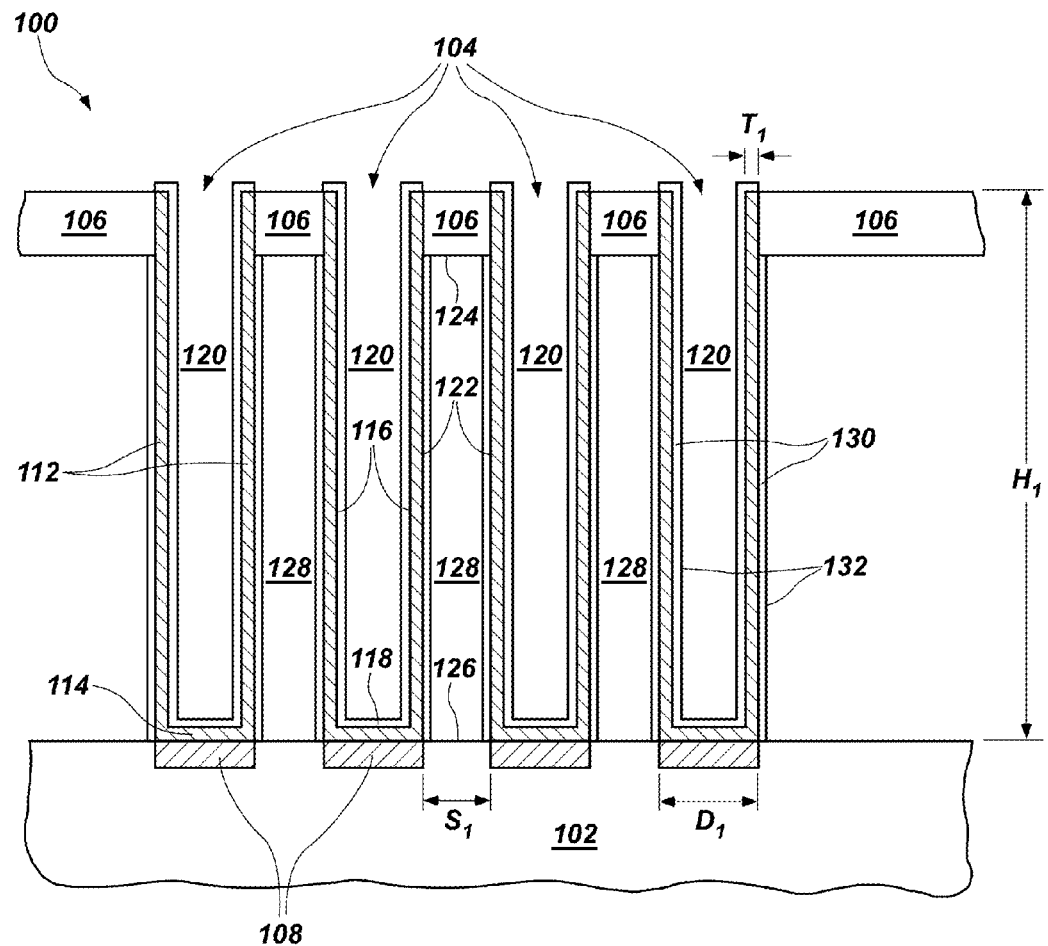

Referring to FIG. 1B, a hydrophobic material 130 may be formed (e.g., by way of spin coating, spray coating, dip coating, immersion, soaking, steeping, etc.) over and in contact with at least exposed surfaces of each of the plurality of structures 104 (e.g., the inner sidewall surfaces 116, the upper floor surface 118, and exposed portions of the outer sidewall surfaces 122). The hydrophobic material 130 may be formed substantially continuously across the exposed surfaces of the plurality of structures 104. The hydrophobic material 130 may substantially conform to the exposed surfaces of the plurality of structures 104. As shown in FIG. 1B, the hydrophobic material 130 may be selectively formed over and in contact with the exposed surfaces of the plurality of structures 104 such that other exposed surfaces of the semiconductor device structure 100 (e.g., exposed surfaces of the substrate 102 and exposed surfaces of the retaining structure 106) remain substantially free of the hydrophobic material 130 (i.e., the hydrophobic material 130 is not substantially formed over and in contact with the other exposed surfaces of the semiconductor device structure 100). In additional embodiments, the hydrophobic material 130 may be formed over and in contact with the exposed surfaces of the plurality of structures 104 and over and in contact with at least one of the other exposed surfaces of the semiconductor device structure 100 (e.g., at least one of the exposed surfaces of the substrate 102 and the exposed surfaces of the retaining structure 106).

The hydrophobic material 130 may be formed of and include a plurality of hydrophobic compounds attached to the plurality of structures 104. The hydrophobic material 130 may be a monolayer of the plurality of hydrophobic compounds. Each of the plurality of hydrophobic compounds may include a polar head group bonded (e.g., by way of a covalent bond) with a Ti atom of the plurality of structures 104 and a hydrophobic tail group directly bonded to the polar head group. The polar head group may be a phosphonate group or a phosphate group. The hydrophobic tail group may be a hydrocarbon group, such as an aliphatic group, a cyclic group, or a combination thereof. As used herein, the term "aliphatic group" means and includes a saturated or unsaturated, linear or branched hydrocarbon group, such as an alkyl group, an alkenyl group, or an alkynyl group. A suitable alkyl group may be a saturated, linear or branched hydrocarbon group including from 6 carbon atoms to 18 carbon atoms, such as hexyl, heptyl, octyl, nonyl, decyl, undecyl, dodecyl, tridecyl, tetradecyl, pentadecyl, hexadecyl, heptadecyl, or octadecyl. A suitable alkenyl group may be an unsaturated, linear or branched hydrocarbon group including from 6 carbon atoms to 18 carbon atoms and at least one carbon-carbon double bond. A suitable alkynyl group may be an unsaturated, linear or branched hydrocarbon group including from 6 carbon atoms to 18 carbon atoms and at least one carbon-carbon triple bond. As used herein, the term "cyclic group" means and includes at least one closed ring hydrocarbon group, such as an alicyclic group, an aryl group, or a combination thereof. A suitable alicyclic group may be a closed ring hydrocarbon group including from 5 to 8 carbons, such as cyclopentyl, cyclohexyl, cycloheptyl, cyclooctyl, or alkyl-substituted derivatives thereof. A suitable aryl group may include a closed aromatic ring or closed aromatic ring system including from 6 carbon atoms to 22 carbon atoms such as phenyl, biphenyl, naphthyl, anthryl, or alkyl-substituted derivatives thereof. Suitable combinations of aliphatic groups and cyclic groups may include, for example, alkyl-substituted aryl groups, and arylalkyl groups. The hydrophobic tail groups of the plurality of hydrophobic compounds facilitate the formation of hydrophobic surfaces 132 on the hydrophobic material 130. For example, a terminal methyl group of the hydrophobic tail group of each of the plurality of hydrophobic compounds may form a portion of the hydrophobic surfaces 132. The terminal methyl group may also enable the hydrophobic surfaces 132 to have a relatively low coefficient of friction. In addition, at least one of Van der Waals attractions between hydrophobic tail groups of adjacent hydrophobic compounds, pi-pi orbital interaction between adjacent conjugated moieties, and intermolecular cross-linking may enhance the stability and mechanical integrity of the hydrophobic material 130. Each of the plurality of hydrophobic compounds in the hydrophobic material 130 may be the same, or at least one of the plurality of hydrophobic compounds may be different than at least one other of the plurality of hydrophobic compounds. The hydrophobic material 130 may exhibit a high degree of molecular order.

Accordingly, a method of forming a semiconductor device structure may comprise forming adjacent structures comprising exposed titanium atoms. A hydrophobic material comprising a plurality of hydrophobic compounds may be formed on the plurality of structures. Each of the plurality of hydrophobic compounds may have a phosphate group bonded to an exposed titanium atom of the adjacent structures.

Furthermore, a semiconductor device structure of the disclosure may include at least one structure comprising titanium, and a hydrophobic material over at least one structure and comprising a plurality of hydrophobic compounds. Each of the hydrophobic compounds may comprise a polar head group bonded to a titanium atom of the at least one structure, and a hydrophobic tail group bonded to the polar head group and comprising a hydrocarbon group.

The hydrophobic material 130 may be formulated and configured such that the hydrophobic surfaces 132 form a contact angle of greater than about ninety degrees (90°) with an aqueous solution, such as greater than or equal to about one-hundred degrees (100°) with the aqueous solution, or greater than or equal to about one-hundred and ten degrees (110°) with the aqueous solution, or greater than or equal to about one-hundred and twenty degrees (120°) with the aqueous solution. As used herein, the term "hydrophobic surface" means and includes a surface exhibiting a contact angle of greater than or equal to about ninety-degrees (90°) when measured in accordance with ASTM Test Method D7334-08, entitled *Standard Practice For Surface Wettability of Coatings, Substrates and Pigments by Advancing Contact Angle Measurement*. As used herein, the term "contact angle" means and includes the angle between a liquid-solid interface and a plane tangent to the liquid-gas interface at a point where a droplet of liquid (e.g., water) meets the solid surface. As used herein, the term "aqueous solution" means and includes a solution of at least one solute in water, a suspension of at least one solute in water, an emulsion of at least one solute in water, combinations thereof, or water substantially free of solute.

A thickness of the hydrophobic material 130 may be such that the hydrophobic material 130 does not substantially alter the distance $S_1$ between the adjacent structures of the plurality of structures 104. The thickness of the hydrophobic material 130 at least partially depends on the molecular size and orientation of the plurality of hydrophobic compounds. By way of non-limiting example, at least where the hydrophobic tail group of each of the plurality of hydrophobic compounds is an aliphatic group including from 6 carbon atoms to 18 carbon atoms, the thickness of the hydrophobic material 130 may be within a range of from about 10 Å to about 25 Å. In at least some embodiments, the thickness of the hydrophobic material 130 is within a range of from about 10 Å to about 12 Å.

An orientation of the hydrophobic tail group of each of the plurality of hydrophobic compounds of the hydrophobic material 130 may approach a direction perpendicular to that of a surface to which the hydrophobic compound is attached. By way of non-limiting example, the orientation of each of the plurality of hydrophobic compounds may be from about ten degrees (10°) off-perpendicular to about thirty degrees (30°) off-perpendicular, or from about fifteen degrees (15°) off-perpendicular to about twenty-five degrees (25°) off-perpendicular. As used herein, the term "off-perpendicular" means and includes the number of degrees that a hydrophobic tail group of a hydrophobic compound is angled from a direction substantially perpendicular to a surface to which the cross-linked hydrophobic compound is bound or attached. In at least some embodiments, each of the plurality of hydrophobic compounds of the hydrophobic material 130 is about twenty degrees (20°) off-perpendicular. The hydrophobic tail groups of the plurality of hydrophobic compounds may be closely packed and oriented parallel to each other such that the hydrophobic material 130 exhibits stiffness in a direction parallel to an underlying surface of the semiconductor device structure 100 (e.g., an underlying surface of the plurality of structures 104).

To form the hydrophobic material 130, the semiconductor device structure 100 may be exposed to a plurality of precursor compounds that interact with the Ti atoms on the exposed surfaces of the plurality of structures 104 to form the plurality of hydrophobic compounds described above. Each of the plurality of precursor compounds may include a reactive head group and a hydrophobic tail group directly bonded to the reactive head group. The reactive head group of each of the plurality of precursor compounds becomes the polar head group of each of the plurality of hydrophobic compounds of the hydrophobic material 130 upon reaction with the Ti atoms of the plurality of structures 104. The reactive head group may be a phosphonate group or a phosphate group. The hydrophobic tail group of each of the plurality of precursor compounds may be the same as the hydrophobic tail group of each of the plurality of hydrophobic compounds of the hydrophobic material 130. Each of the plurality of precursor compounds may be selected such that the plurality of precursor compounds do not substantially react with each other (e.g., cross-link) prior to attaching to the plurality of structures 104. By way of non-limiting example, each of the plurality of precursor compounds may be an organo-phosphonic acid or an organo-phosphoric acid, respectively having the structure shown below:

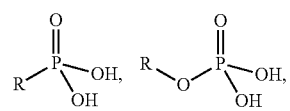

where R is the hydrophobic tail group as previously described above. Non-limiting examples of compounds that may be utilized as the plurality of precursor compounds include mono(n-hexyl)phosphonic acid, mono(n-heptyl)phosphonic acid, mono(n-octyl)phosphonic acid, mono(n-nonyl)phosphonic acid, mono(n-decyl)phosphonic acid, mono(n-undecyl)phosphonic acid, mono(n-dodecyl)phosphonic acid, mono(n-tridecyl)phosphonic acid, mono(n-tetradecyl)phosphonic acid, mono(n-pentadecyl)phosphonic acid, mono(n-hexadecyl)phosphonic acid, mono(n-heptadecyl)phosphonic acid, mono(n-octadecyl)phosphonic acid, mono(2-ethylhexyl)phosphonic acid, mono(isodecyl)phosphonic acid, mono(oleyl)phosphonic acid, mono(stearyl)phosphonic acid, or combinations thereof. In at least some embodiments, each of the plurality of precursor compounds is mono(n-octyl)phosphonic acid.

Accordingly, a method of forming a hydrophobic surface on a semiconductor device structure may comprise forming at least one structure having at least one exposed surface comprising titanium atoms. The at least one exposed surface of at least one structure may be contacted with at least one of an organo-phosphonic acid and an organo-phosphoric acid to form a material having a hydrophobic surface on the at least one exposed surface of the least one structure.

The plurality of structures 104 may be exposed to or treated with the plurality of precursor compounds until substantially all of the Ti atoms on the exposed surfaces of the plurality of structures 104 bond (e.g., through a monodentate interaction, such as covalent bonding) with at least a portion of the plurality of precursor compounds, or until access to remaining Ti atoms on the exposed surfaces of the plurality of structures 104 is substantially impeded or prevented. The plurality of precursor compounds may spontaneously adsorb to the plurality of structures 104. The formation of the hydrophobic material 130 may terminate when Ti atoms are no longer available (i.e., unreacted with a precursor compound of the plurality of precursor compounds, and accessible for reaction with a precursor compound of the plurality of precursor compounds) on the exposed surfaces of the plurality of structures 104. Accordingly, the formation of the hydrophobic material 130 on the exposed surfaces of the plurality of structures 104 may be self-assembled and self-limiting.

In one of more embodiments, a solution including the plurality of precursor compounds and at least one solvent may be used to contact the exposed surfaces of the plurality of structures 104 with the plurality of precursor compounds. The at least one solvent may be any solvent in which the plurality of precursor compounds is substantially soluble including, but not limited to, an organic solvent, such as an alcohol (e.g., ethanol, isopropanol, etc.). In at least some embodiments, the at least one solvent is isopropanol. The solution may include a concentration of the plurality of precursor compounds sufficient to impart the hydrophobic surface 132 of the hydrophobic material 130 with the contact angle previously described above (e.g., greater than or equal to about ninety degrees (90°)). In one or more embodiments, the concentration of the plurality of precursor compounds may facilitate bonding with at least a majority of the Ti atoms on the exposed surfaces of the plurality of structures 104. The concentration of the plurality of precursor compounds in the solution may be tailored to the surface area and the surface chemistry (e.g., Ti atom content) of at least the plurality of structures 104. The solution may include an excess of the plurality of precursor compounds relative to the number of available Ti atoms on the exposed surfaces of the plurality of structures 104. As a non-limiting example, the concentration of the plurality of precursor compounds in the solution may be within a range of from about 1 milliMolar (mM) to about 10 mM. In at least some embodiments, the semiconductor device structure 100 may be exposed to a 1 mM solution of mono(n-octyl)phosphonic acid in isopropanol.

The semiconductor device structure 100 may be exposed to the solution by conventional techniques including, but not limited to, spin coating, spray coating, dip coating, immersion, soaking, or steeping. In at least some embodiments, the semiconductor device structure 100 is immersed in the solution at a sufficient temperature and for a sufficient period of time to facilitate self-assembly of the hydrophobic material 130 in a manner consistent with that described above. By way of non-limiting example, the semiconductor device structure 100 may be immersed in the solution at a temperature within a range of from about ambient temperature (e.g., from about 20° C. to about 25° C.) to just below the boiling point of the at least one solvent of the solution (e.g., below about 82.5° C. if the at least one solvent is isopropanol, such as about 80° C.), for a period of time within a range of from about 30 seconds to about 5 hours, such as from about 1 minute to about 2 hours, or from about 2 minutes to about 1 hour, or from about 2 minutes to about 20 minutes. An increase in the temperature may facilitate a decrease in the period of time the semiconductor device structure 100 is immersed. In at least some embodiments, the semiconductor device structure 100 may be immersed in a 1 mM solution of mono(n-octyl)phosphonic acid in isopropanol at a temperature of about 50° C. for about 10 minutes.

In additional embodiments, the semiconductor device structure 100 may be exposed to a gas or vapor including the plurality of precursor compounds. As a non-limiting example, the plurality of precursor compounds may be dissolved in the at least one solvent (e.g., isopropanol) to from the solution, the solution may be heated to above the boiling point of the at least one solvent (e.g., above 82.5° C. if the at least one solvent is isopropanol) to form a vapor including the plurality of precursor compounds, and the semiconductor device structure 100 may be exposed to the vapor (e.g., in a suitable containment vessel, such as a sealed pressure vessel) for sufficient period of time to facilitate self-assembly of the hydrophobic material 130 in a manner consistent with that described above.

The hydrophobic surfaces 132 of the hydrophobic material 130 may have a lower surface energy than the surfaces (e.g., the outer sidewall surfaces 122, and the inner sidewall surfaces 116) of the plurality of structures 104. The lower surface energy of the hydrophobic surfaces 132 may substantially limit or even prevent toppling or collapse of the plurality of structures 104. Without being bound by theory, it is believed that the hydrophobic surfaces 132 of the hydrophobic material 130 may reduce the adhesion forces between surfaces within the capillaries 128 and a liquid, such as water, within the capillaries 128. In addition, the lower surface energy of the hydrophobic surfaces 132 may substantially limit or even prevent stiction between the adjacent structures of the plurality of structures 104 in the event that the adjacent structures (including materials thereon, such as the hydrophobic material 130) come into contact. Without being bound by theory, it is believed that the hydrophobic material 130 reduces adhesion forces between contacting surfaces. Accordingly, by modifying the structures 104 to increase their hydrophobicity, the hydrophobic material 130 may substantially reduce or even eliminate adhesion-related damage to the semiconductor device structure 100.

Figure 1C:
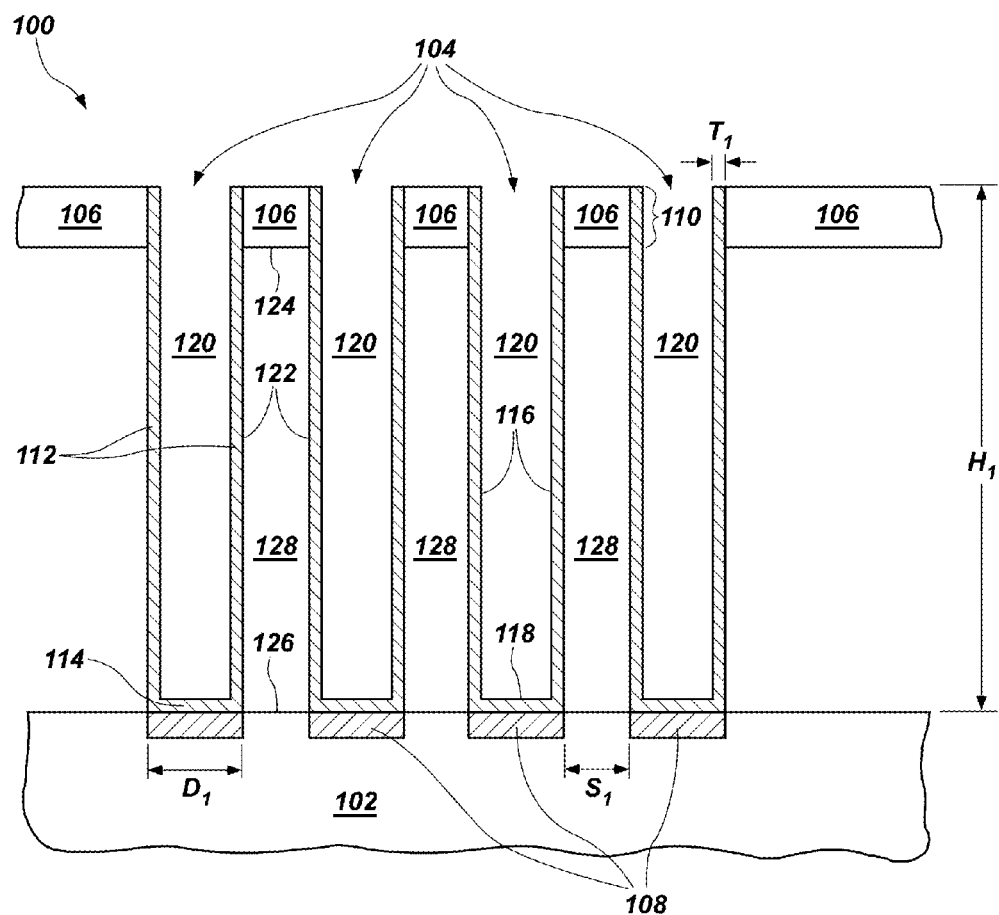

Referring to FIG. 1C, following the formation of the hydrophobic material 130, the semiconductor device structure 100 may be rinsed (e.g., with isopropanol, water, etc.), dried (e.g., blow dried with an inert gas, such as nitrogen gas; spin dried; dried with conventional supercritical carbon dioxide methods; etc.), and the hydrophobic material 130 (FIG. 1B) may be removed. Any process which does not result in stiction of adjacent structures of the plurality of structures 104 may be used to remove the hydrophobic material 130. The hydrophobic material 130 may be, for example, removed by at least one of annealing (e.g., thermally annealing, reactively annealing, etc.) the semiconductor device structure 100 and exposing the semiconductor device structure 100 to one or more of high energy radiation (e.g., ultraviolet radiation), ozone, plasma, reactive ions, and an oxidizing agent. By way of non-limiting example, the semiconductor device structure 100 may be exposed to a temperature greater than or equal to a desorption temperature of the hydrophobic material 130, such as greater than or equal to about 150° C., such as from about 200° C. to about 400° C.

Figure 1D:
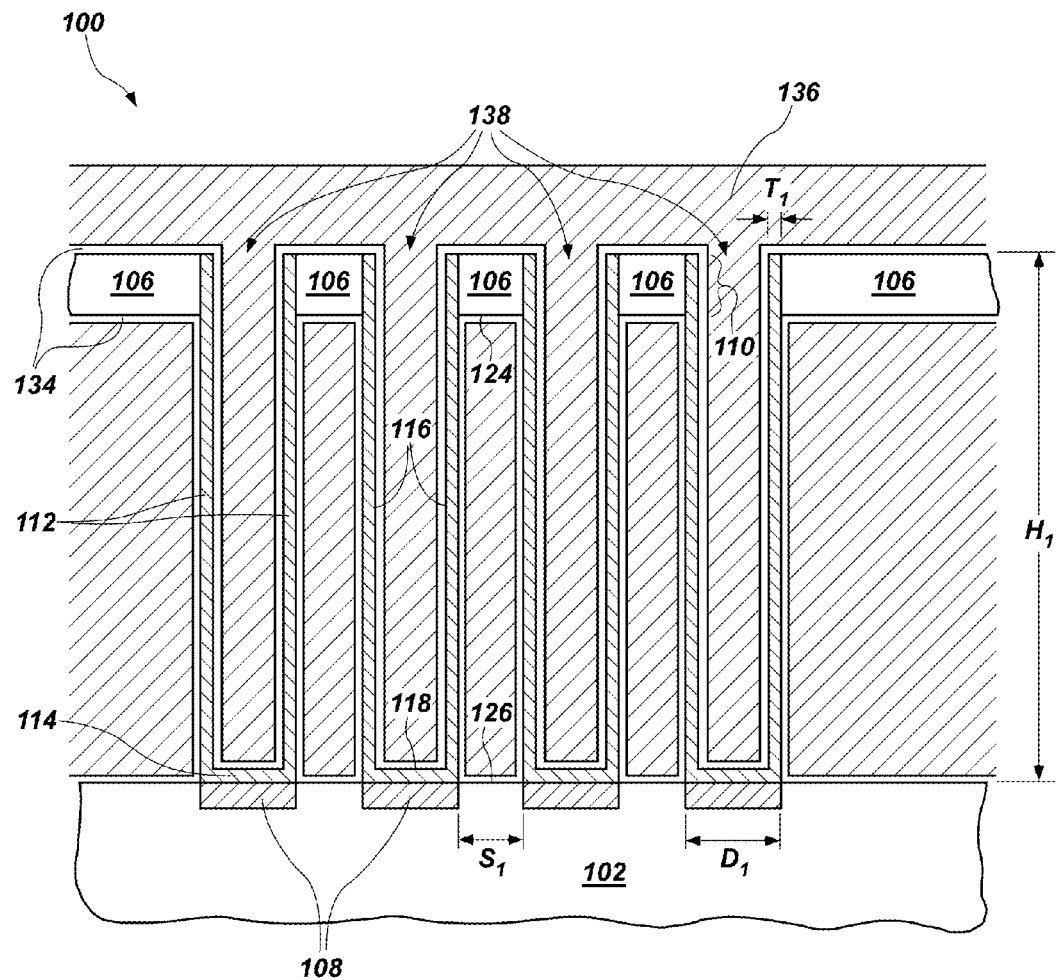

Referring to FIG. 1D, following the removal of the hydrophobic material 130, the semiconductor device structure 100 may be subjected to additional processing. By way of non-limiting example, as shown in FIG. 1D, a dielectric material 134 may be formed over and in contact with exposed surfaces of the semiconductor device structure 100 (e.g., exposed surfaces of each of the substrate 102, the retaining structure 106, and the plurality of structures 104), and a conductive material 136 may be formed over and in contact with the dielectric material 134. The dielectric material 134 may substantially conform to the exposed surfaces of the semiconductor device structure 100, and the conductive material 136 may fill remaining space within the openings 120 (FIG. 1C) and the capillaries 128 (FIG. 1C). The dielectric material 134 may be formed of and include at least one electrically insulative material including, but not limited to, an electrically insulative oxide, and an electrically insulative nitride. The conductive material 136 may formed of and include at least one electrically conductive material including, but not limited to, a metal (e.g., platinum, titanium, tungsten, ruthenium, etc.), a metal-containing composition (e.g., a metal nitride, a metal silicide, etc.), and a conductively doped semiconductor material (e.g., conductively doped silicon, conductively doped germanium, etc.). The dielectric material 134 and the conductive material 136 may be formed using conventional techniques, such as a physical vapor deposition ("PVD") technique, a chemical vapor deposition ("CVD") technique, or an atomic layer deposition ("ALD") technique. PVD includes, but is not limited to, sputtering, evaporation, or ionized PVD. Such deposition techniques are known in the art and, therefore, are not described in detail herein.

In one or more embodiments, the degradation temperature of the hydrophobic material 130 may be less than or equal to a temperature used to form the dielectric material 134 over and in contact with the exposed surfaces of the semiconductor device structure 100. Accordingly, in such embodiments, the removal of the hydrophobic material 130 and the formation of the dielectric material 134 may be performed in a single reaction chamber without breaking vacuum to the reaction chamber. The removal of the hydrophobic material 130 and the formation of the dielectric material 134 may be performed in a single processing act, such that the hydrophobic material 130 is volatilized and removed substantially simultaneously with the formation of the dielectric material 134. In yet additional embodiments, the removal of the hydrophobic material 130 may be omitted, and the dielectric material 134 may be formed over and in contact with the hydrophobic material 130.

With continued reference to FIG. 1D, the conductive material 136, dielectric material 134, and the plurality of structures 104 (FIG. 1C) form a plurality of capacitors 138. The conductive material 136 may be considered to form a capacitor plate extending across the plurality of capacitors 138. The plurality of capacitors 138 may be electrically coupled to a plurality of bitlines (not shown) through a plurality of transistor gates (not shown). The bitlines and the transistor gates may be conventionally formed at an appropriate processing stage. The transistor gates may be coupled to a plurality of wordlines (not shown). The combination of the wordlines and the bitlines may facilitate addressing of dynamic random access memory (DRAM) cells including the plurality of capacitors 138. The plurality of capacitors 138 may, therefore, be incorporated into a DRAM array.

Figure 2A:
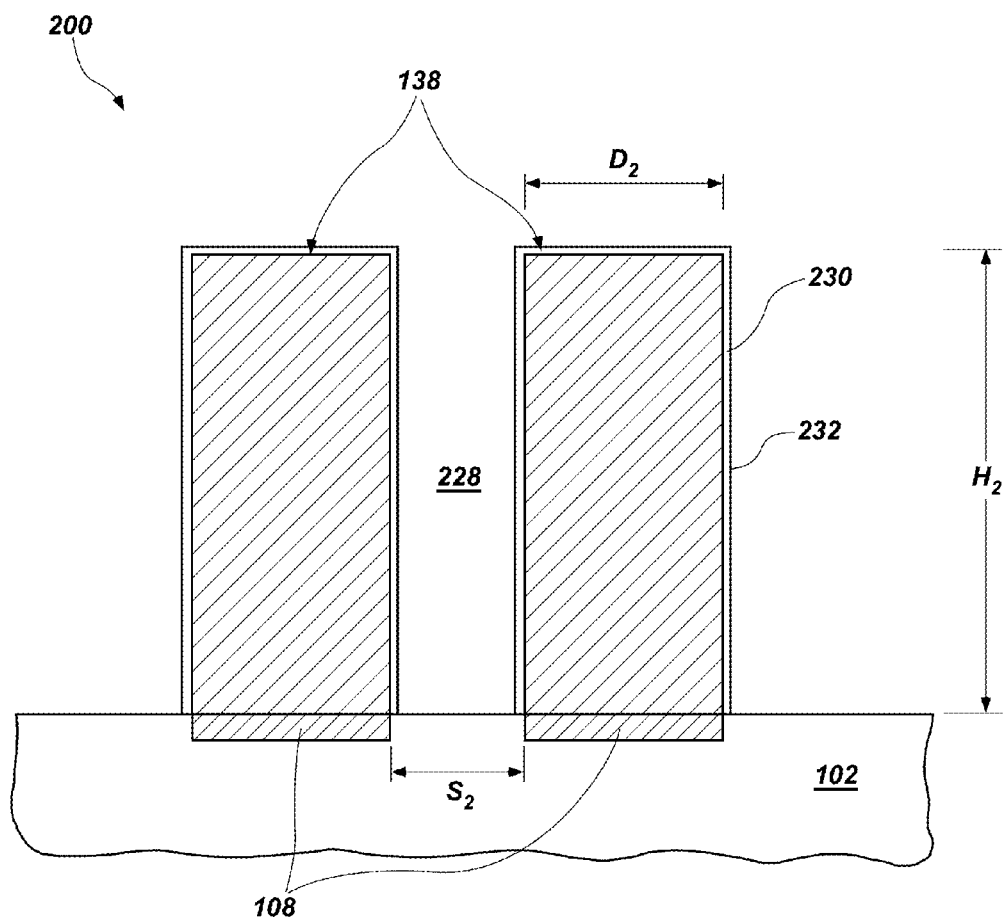
FIGS. 2A and 2B are partial cross-sectional views of a semiconductor device structure and illustrate various stages of another method of forming a plurality of capacitors in accordance with embodiments of the disclosure.
Figure 2B:
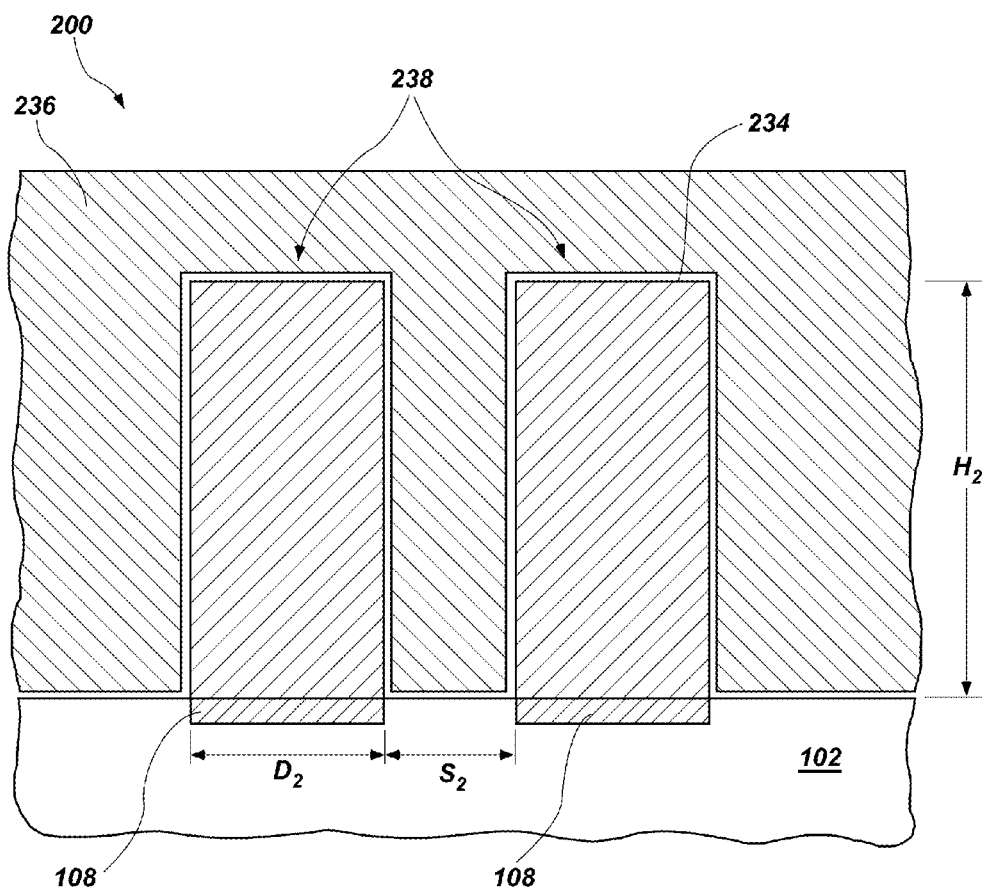

As previously described above, the method of the disclosure may be applicable to structures beyond those depicted in FIGS. 1A-1D. By way of non-limiting example and referring to FIG. 2A, the above process may be used to form hydrophobic material 230 having a hydrophobic surface 232 over and in contact with at least surfaces of a plurality of structures 204 of a semiconductor device structure 200. As shown in FIG. 2A, each of the plurality of structures 204 may have a stud-type shape. Each of the plurality of structures 204 may have a diameter $D_2$ and a height $H_2$ substantially similar to the diameter $D_1$ and the height $H_1$ described above in reference to FIG. 1A, or at least one of the diameter $D_2$ and the height $H_2$ of each of the plurality of structures 204 may be substantially different than the diameter $D_1$ and the height $H_1$ described above with reference to FIG. 1A. In addition, a distance $S_2$ between adjacent structures of the plurality of structures 204 may be substantially similar to the distance $S_1$ described above in reference to FIG. 1A, or the distance $S_2$ between at least one structure of the plurality of structures 204 and at least one other structure of the plurality of structures 204 may be substantially different than the distance $S_1$ described above with reference to FIG. 1A. Each of the plurality of structures 204 may be formed of and include a titanium-containing material (e.g., Ti, TiN, TiC, TiSi, $TiSi_2$, TiO, $TiO_2$, a Ti alloy, etc.). Furthermore, the formation of the hydrophobic material 230 over and in contact with the plurality of structures 204, and subsequent processing of the plurality of structures 204 may be substantially similar to that described above with reference to FIGS. 1B through 1D, resulting in a plurality of capacitors 238 including a dielectric material 234, a conductive material 236, and the plurality of structures 204, as depicted in FIG. 2B.

In additional embodiments, the method of the disclosure may be used to form a hydrophobic material on a substantially planar structure including Ti. In yet additional embodiments, the method of the disclosure may be used to form a hydrophobic material on a titanium material coating at least one structure (e.g., a titanium material coating a structure having one of a rectangular column shape, a cylindrical column shape, a dome shape, a pyramid shape, a frusto-pyramidal shape, a cone shape, a frusto-conical shape, a fin shape, a pillar shape, a container shape, a stud shape, a circular shape, an ovular shape, a quadrilateral shape, and an irregular shape).

The properties of the hydrophobic material 130, 230 of the disclosure may substantially alleviate adhesion problems (e.g., toppling, collapse, and stiction, such as release-related stiction and in-use stiction) related to the formation of the plurality of capacitors 138, 238. The hydrophobic material 130, 230 exhibits low surface energy, a low coefficient of friction, and high wear resistance. In addition, the hydrophobic material 130, 230 is chemically inert. In some embodiments, hydrophobic material 130, 230 enables beading of the aqueous solution from the hydrophobic surfaces 132, 232 and/or changes a meniscus of aqueous solution within capillaries 128, 228 from concave to convex. In some embodiments, some stiction may occur in spite of hydrophobic material 130, 230, but the hydrophobic material 130, 230 can advantageously provide insulation between adjacent structures (e.g., to substantially avoid electrical shorting). The hydrophobic material 130, 230 may substantially improve a yield of undamaged structures 104, 204 for the semiconductor device structure 100, 200 relative to conventional methods of forming the semiconductor device structure 100, 200. The methods of the disclosure advantageously enable the formation of semiconductor device structures (e.g., DRAM structures, NAND structures, MEMS structures, etc.) memory cells, and semiconductor devices that exhibit increased reliability, performance, and durability.

The following examples serve to explain embodiments of the disclosure in more detail. The examples are not to be construed as being exhaustive or exclusive as to the scope of the disclosure.

EXAMPLES

Example 1

X-Ray Photoelectron Spectroscopy (XPS) Surface Analysis

Figure 3:
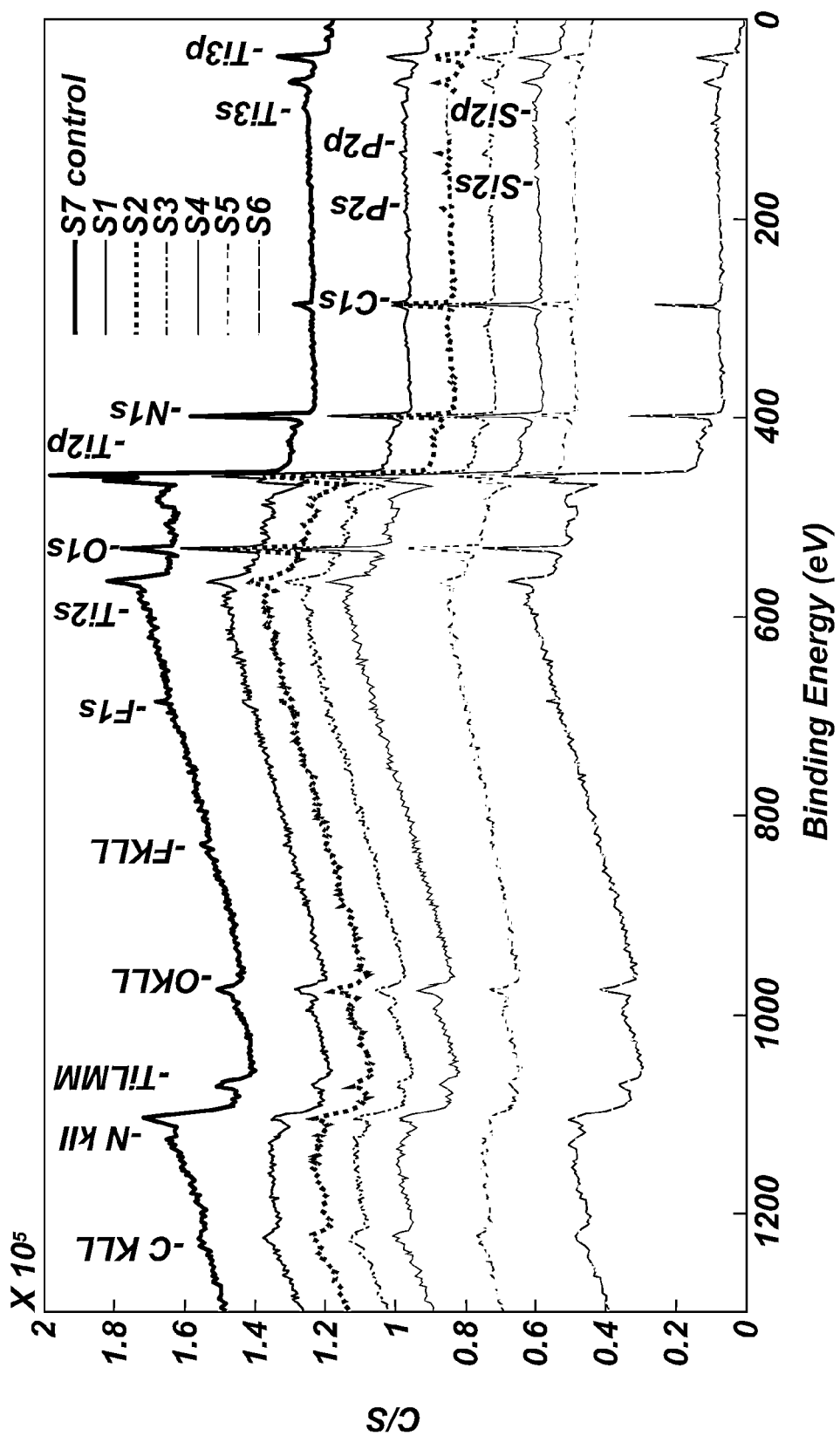
FIG. 3 is an X-ray photoelectron spectroscopy (XPS) survey spectrum showing the surface chemistry of a surface modified using an embodiment of the method of the disclosure, as described in Example 1.

Three coupon samples were prepared by treating substrate stacks including TiN (72 Å), Ti (100 Å), and an oxide (1 kÅ) with a 1 mM solution of mono(n-octyl)phosphonic acid in isopropanol under a variety of conditions. A film was formed on the TiN surfaces of each of the coupon samples. The three coupon samples and one control sample were subjected to XPS analysis. The control sample was a substrate stack as described above that was not treated with the 1 mM solution of mono(n-octyl)phosphonic acid in isopropanol. As shown in FIG. 3, XPS survey spectra of the six coupon samples detected the presence of C, N, O, P, Ti, and trace F and Si at the surface tested (i.e., the surface including the film). High resolution XPS spectra of C1s, N1s, O1s, P2p, and Ti3s were acquired at 30 degree take-off angle (TOA) for quantification. The surface elemental concentrations in atom % for the six coupon samples and the control sample are shown below in Table 1, along with the atomic ratios of C/Ti. The XPS analysis results indicate the mono(n-octyl)phosphonic acid of the solution bonded to the TiN surfaces of the each of the substrate stacks. The XPS analysis results illustrate the reproducibility of the method of the disclosure.

TABLE 1

XPS Analysis Data

| Sample | Elemental Concentrations (atomic %) at 30° TOA | | | | | Atomic Ratio |
|---|---|---|---|---|---|---|
| | C | N | O | P | Ti | C/Ti |
| Control | 12.6 | 37.1 | 15.2 | ND | 35.1 | 0.36 |
| S1 | 35.2 | 19.9 | 20.2 | 1.7 | 23.0 | 1.53 |
| S2 | 38.4 | 17.6 | 19.8 | 2.7 | 21.5 | 1.79 |
| S3 | 38.8 | 18.6 | 19.6 | 1.7 | 21.4 | 1.82 |

Example 2

TOF-SIMS Analysis

Three coupon samples were prepared by treating substrate stacks including TiN (72 Å), Ti (100 Å), and an oxide (1 kÅ) with a 1 mM solution of mono(n-octyl)phosphonic acid in isopropanol under a variety of conditions. A film was formed on the TiN surfaces of each of the coupon samples. The three coupon samples and one control sample were subjected to TOF-SIMS analysis using an IonTOF TOFSIMS 5 instrument, equipped with a hot/cold variable temperature stage using 25 KeV $Bi_1^+$ primary analysis ions. The control sample was a substrate stack as described above that was not treated with the 1 mM solution of mono(n-octyl)phosphonic acid in isopropanol.

Figure 4A:
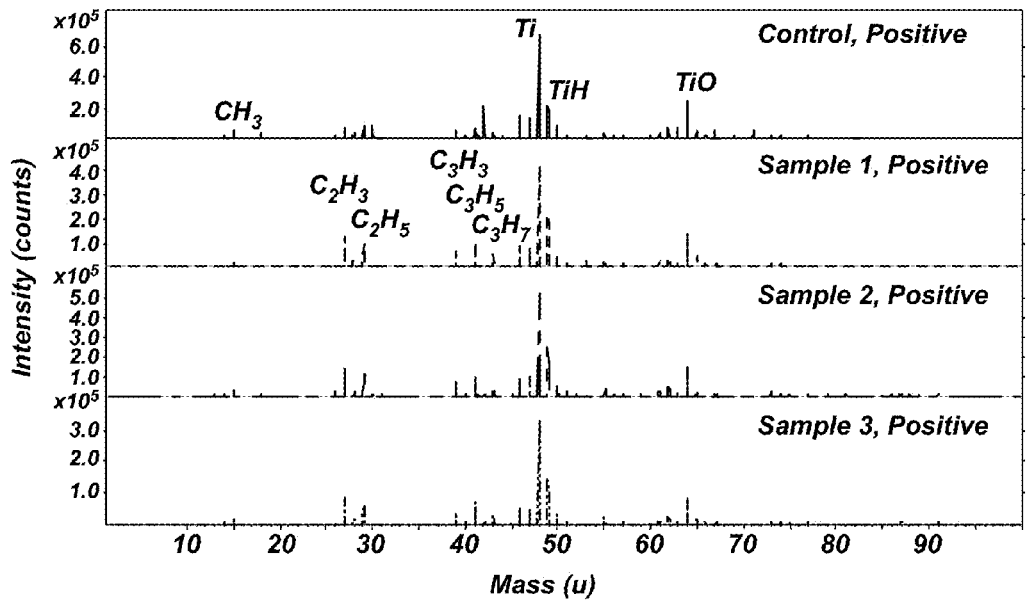
FIGS. 4A and 4B are, respectively, positive mode and negative mode survey mass spectra showing the chemistry of films formed on titanium nitride surfaces using an embodiment of the method of the disclosure, as described in Example 2.
Figure 4B:
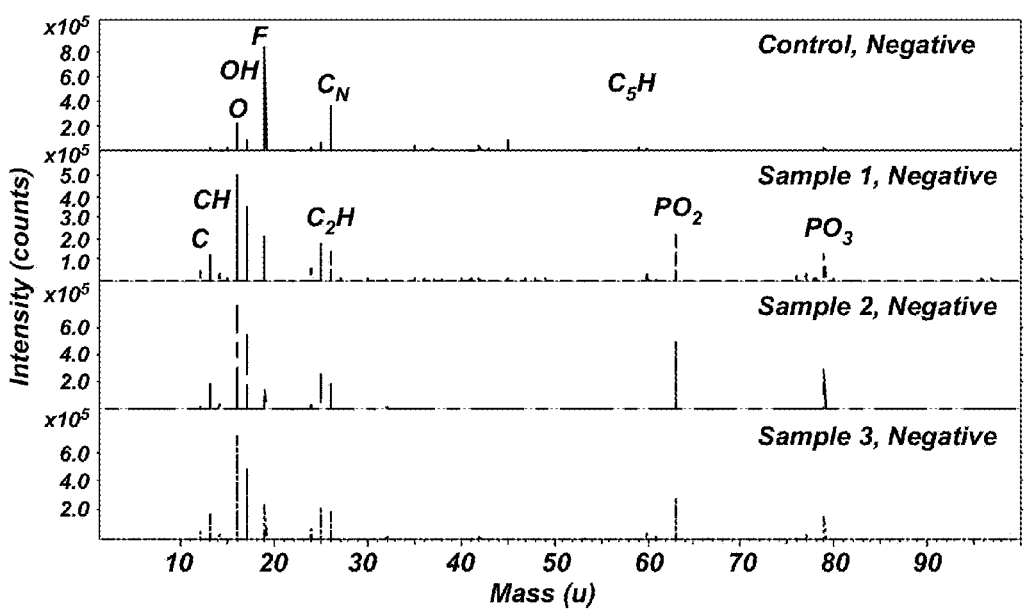
Figure 5A:
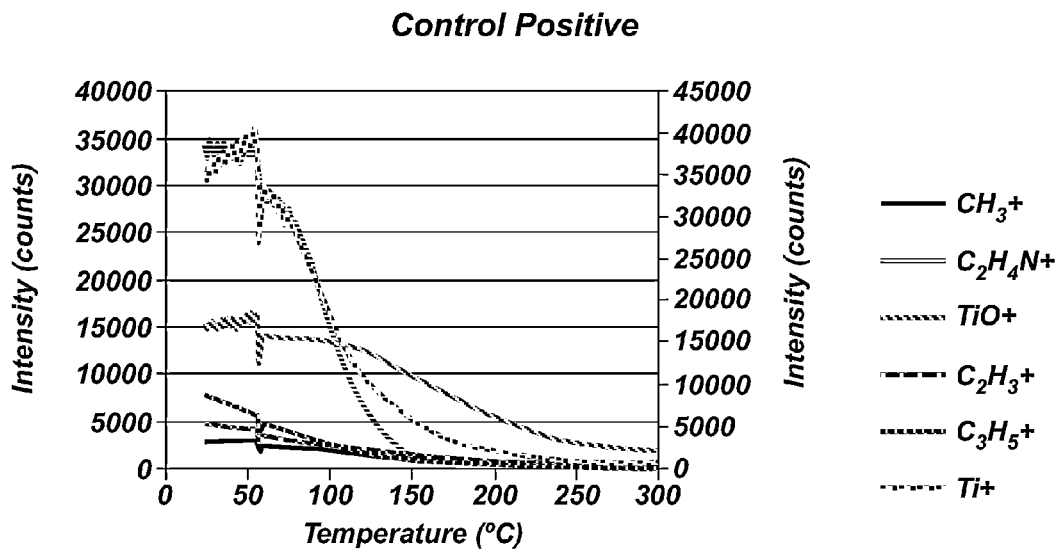
FIGS. 5A through 8B are graphs illustrating the thermal desorption profiles of select positive ions and select negative ions for a control sample and for multiple coupon samples formed using an embodiment of the method of the disclosure, as described in Example 2.
Figure 5B:
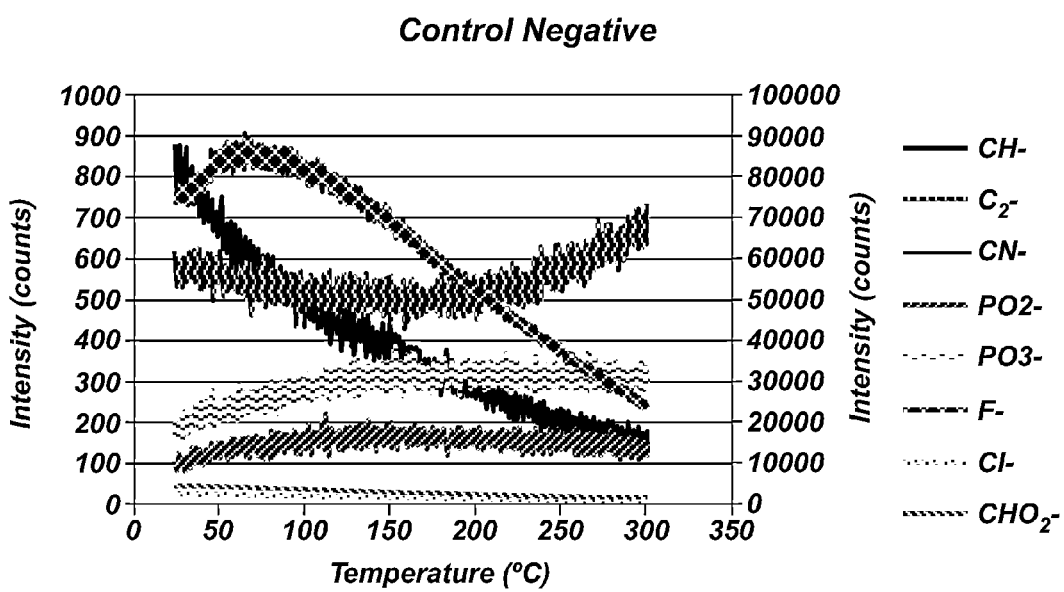
Figure 6A:
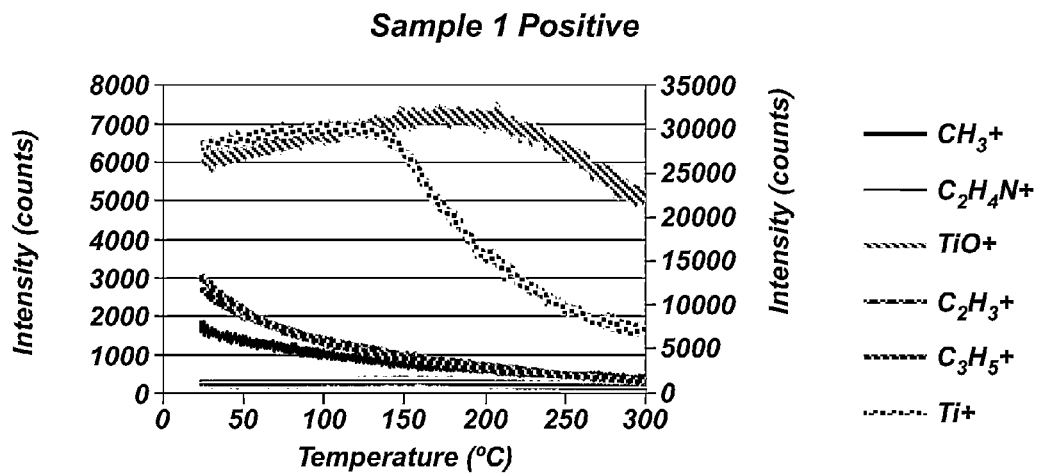
Figure 6B:
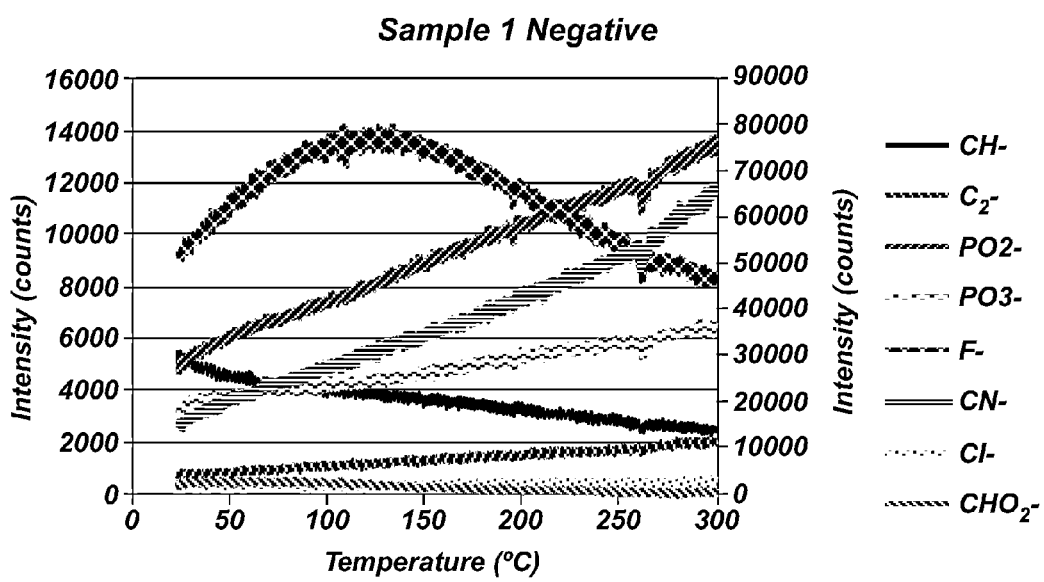
Figure 7A:
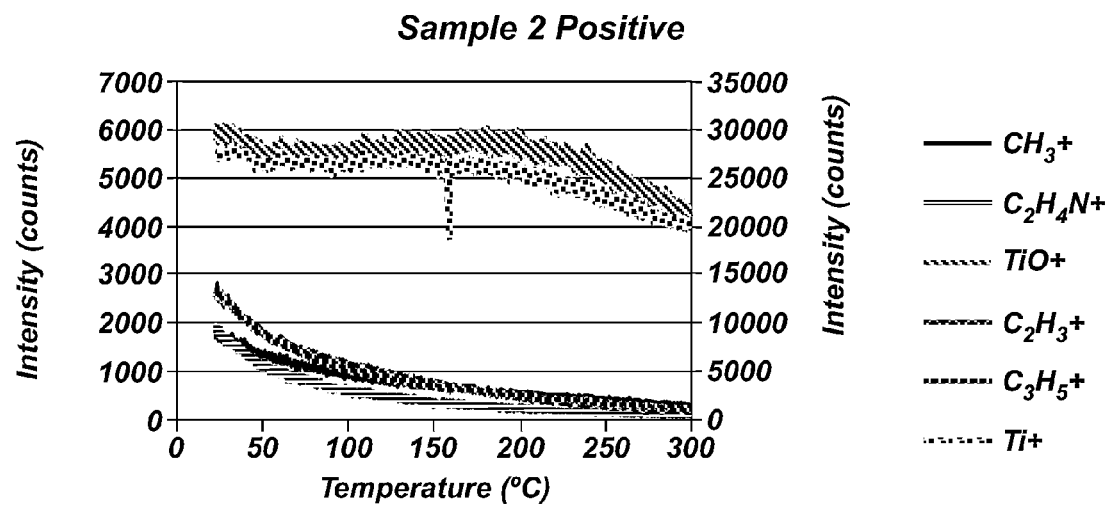
Figure 7B:
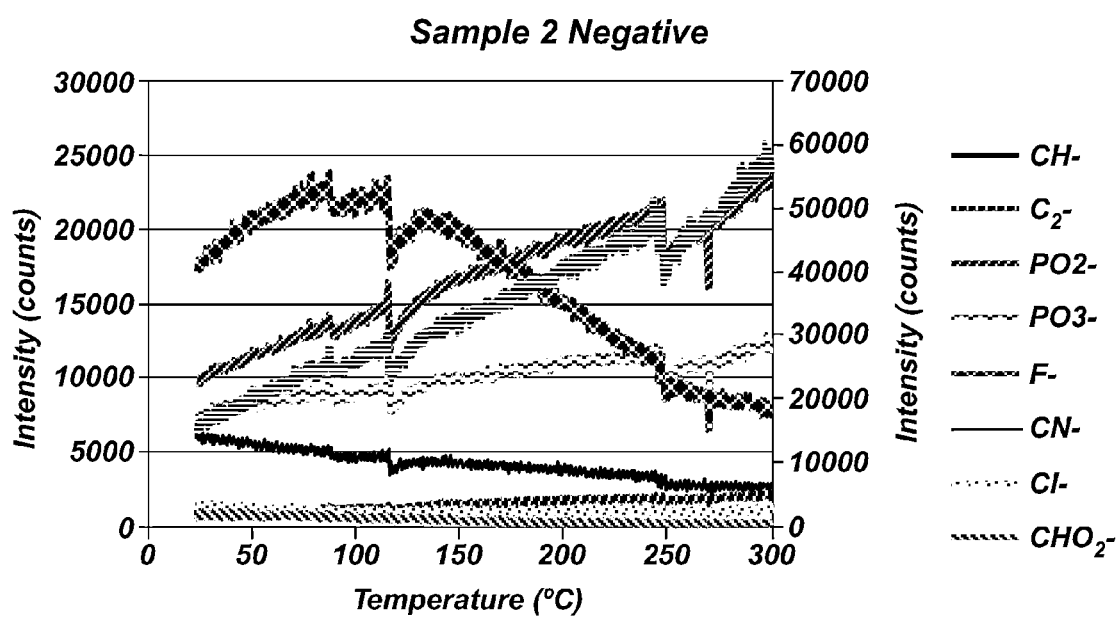
Figure 8A:
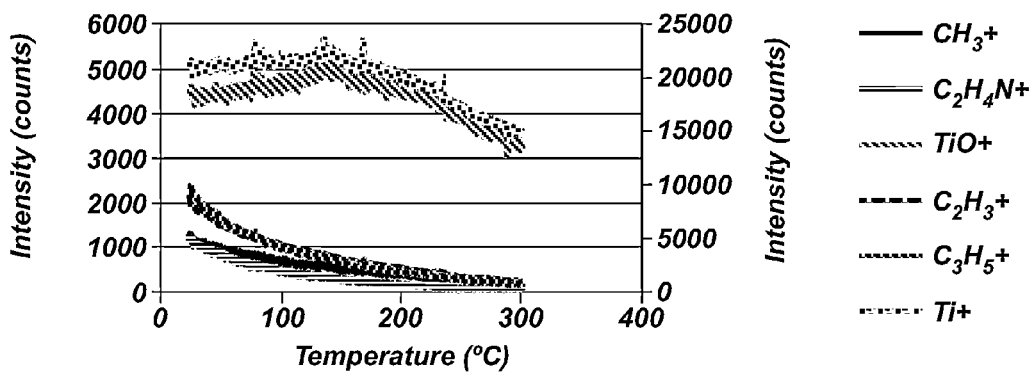
Figure 8B:
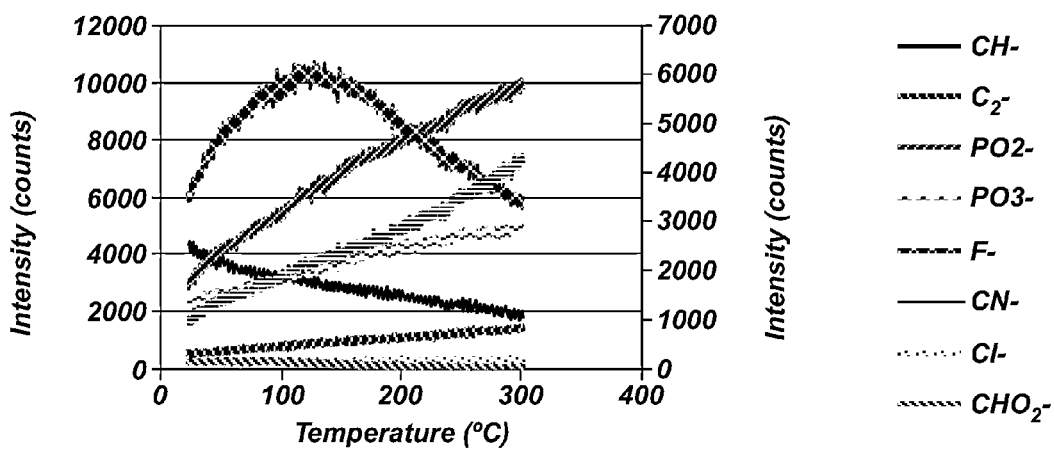
Figure 9A:
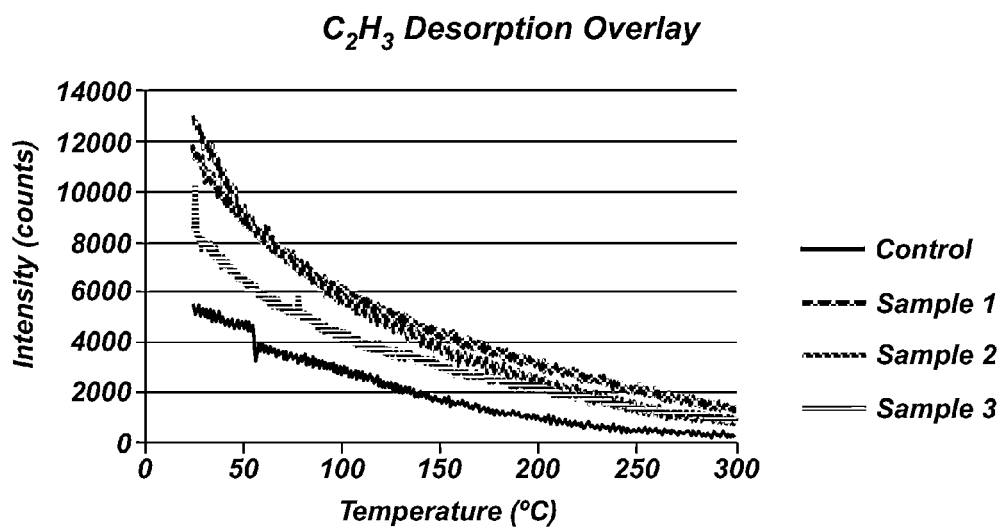
FIGS. 9A and 9B are graphs respectively illustrating the $C_2H_3$ thermal desorption profiles and the $PO_2^-$ thermal desorption profiles for a control sample and for multiple coupon samples formed using an embodiment of the method of the disclosure, as described in Example 2.
Figure 9B:
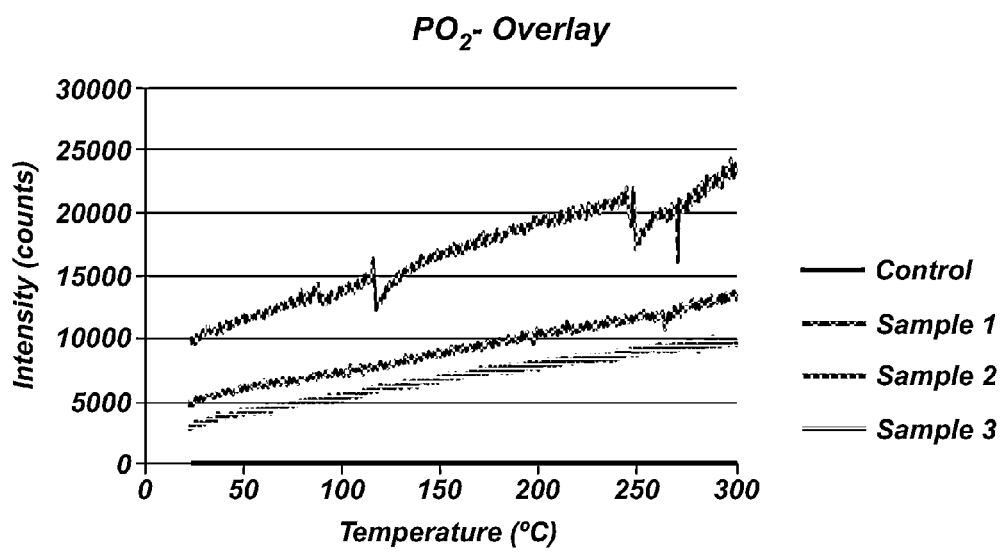

FIGS. 4A and 4B depict positive mode (FIG. 4A) and negative mode (FIG. 4B) survey mass spectra from each coupon sample and the control sample integrated over the entire temperature desorption profile. From these spectra and knowledge of the molecular structure of mono(n-octyl)phosphonic acid, several secondary ions of interest were selected. FIGS. 5A and 5B depict the thermal desorption profiles for selected positive ions (FIG. 5A) and selected negative ions (FIG. 5B) for the control sample. FIGS. 6A and 6B depict the thermal desorption profiles for selected positive ions (FIG. 6A) and selected negative ions (FIG. 6B) for coupon sample 1. FIGS. 7A and 7B depict the thermal desorption profiles for selected positive ions (FIG. 7A) and selected negative ions (FIG. 7B) for coupon sample 2. FIGS. 8A and 8B depict the thermal desorption profiles for selected positive ions (FIG. 8A) and selected negative ions (FIG. 8B) for coupon sample 3. FIG. 9A depicts a $C_2H_3$ thermal desorption overlay for the three coupon samples (i.e., coupon samples 1, 2, and 3) and the control sample. FIG. 9B depicts a $PO_2^-$ thermal desorption overlay for the three coupon samples and the control sample.

The results of the TOF-SIMS indicate the film of each coupon sample was a monolayer or less in thickness, primarily due to the relative intensities of the Ti and organic fragment secondary ions. Aliphatic organic fragment ions are higher than those resulting from contamination of the control sample. The control sample was freshly prepared, while the coupon samples accumulated contamination for several weeks prior to analysis. The presence of mono(n-octyl)phosphonic acid cross-linked to the TiN surface is indicated by the presence of the $PO_2^-$ and $PO_3^-$ secondary ions. The intensity of the phosphate ions is not believed to indicate a linear relationship with coverage in the thermal profile. Namely, the phosphate head group of the mono(n-octyl)phosphonic acid is believed to react with the TiN surface, and cross-linked mono(n-octyl)phosphonic acid may be thermally degraded at the temperatures studied, with the organic portion of the cross-linked mono(n-octyl)phosphonic acid being more thermally labile than the mono(n-octyl) phosphonic acid as a whole. This is suggested by the overlay profiles shown in FIGS. 9A and 9B, wherein $C_2H_3^+$ intensity decreases with increasing temperature (FIG. 9A), while $PO_2^-$ intensity increases with increasing temperature (FIG. 9B).

Example 3

Contact Angle Testing

Figure 10A:
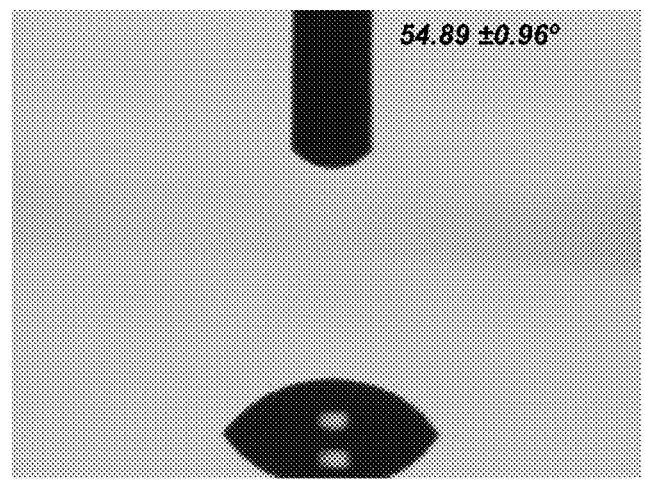
FIGS. 10A through 10C are photographs showing the contact angle of an uncleaned titanium nitride surface, a clean titanium nitride surface, and a titanium nitride surface modified with a film formed using an embodiment of the method of the disclosure, respectively, as described in Example 3.
Figure 10B:
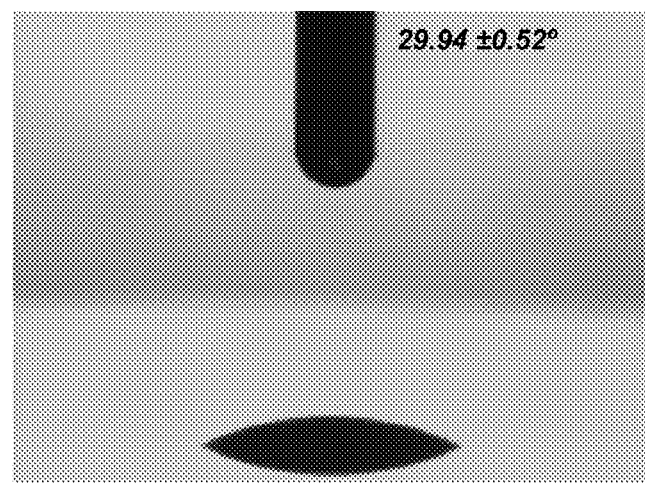
Figure 10C:
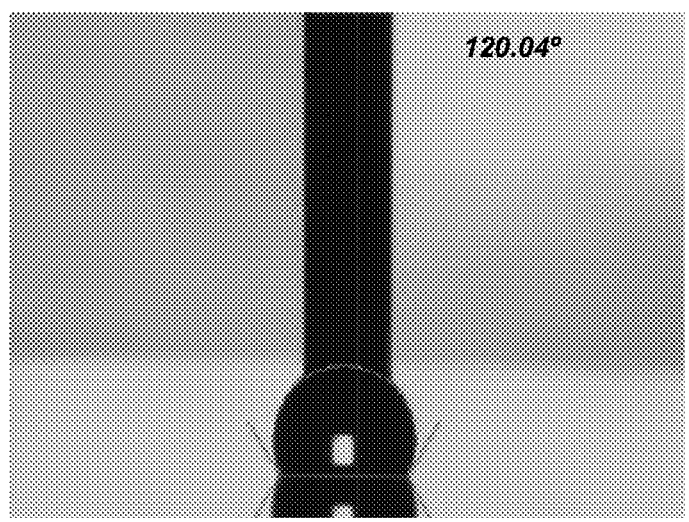

The contact angle of a surface of a substrate stack before and after treatment with mono(n-octyl)phosphonic acid was tested. The substrate stack included TiN (72 Å), Ti (100 Å), and an oxide (1 kÅ). As depicted in FIG. 10A, the surface of the TiN exhibited a contact angle about fifty-five degrees (55°) prior to cleaning. The surface of the TiN was cleaned by exposure to aqueous hydrofluoric acid (100:1) for two minutes, followed by exposure to tetramethylammonium hydroxide (TMAH) at 80° C. for six minutes, followed by exposure to aqueous hydrofluoric acid (100:1) for one minute. As depicted in FIG. 10B, the cleaned surface of the TiN exhibited a contact angle about thirty degrees (30°). The substrate stack was then immersed in a 1 mM solution of mono(n-octyl) phosphonic acid in isopropanol at 50° C. for 10 minutes, forming a film on the cleaned surface of the TiN. As depicted in FIG. 10C, the surface of the film exhibited a contact angle about one-hundred and twenty degrees (120°), indicating that a hydrophobic surface was formed on the TiN.

Example 4

Comparative Analysis of Structural Integrity

Figure 11:
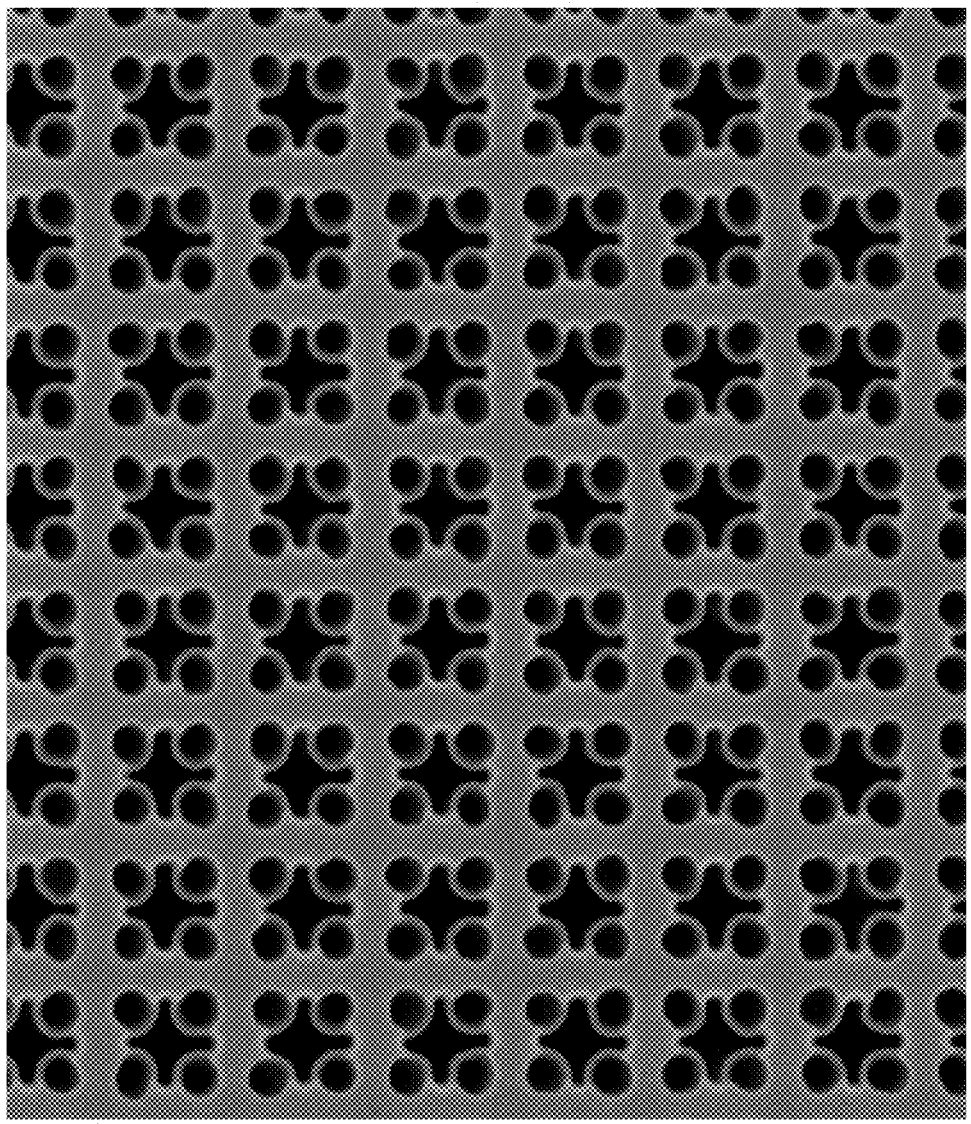
FIG. 11 is a scanning electron micrograph (SEM) showing a top-down view of a plurality of structures of a semiconductor device structure, as described in Example 4.

A first structure including a plurality of container-shaped TiN structures processed using conventional techniques was compared to a second structure including a plurality of container-shaped TiN structures processed according to the methods of the disclosure. Each of the plurality of container-shaped TiN structures of the first structure and each of the plurality of container-shaped TiN structures of the second structure were cylindrical in shape, and exhibited an length of approximately 15 kÅ, a diameter of approximately 400 Å, and a sidewall thickness of approximately 65 Å. FIG. 11 is a scanning electron micrograph (SEM) showing a partial top-down view of an as-fabricated structure including such a plurality of container-shaped TiN structures (i.e., prior to conventional processing or processing according to the methods of the disclosure).

Figure 12A:
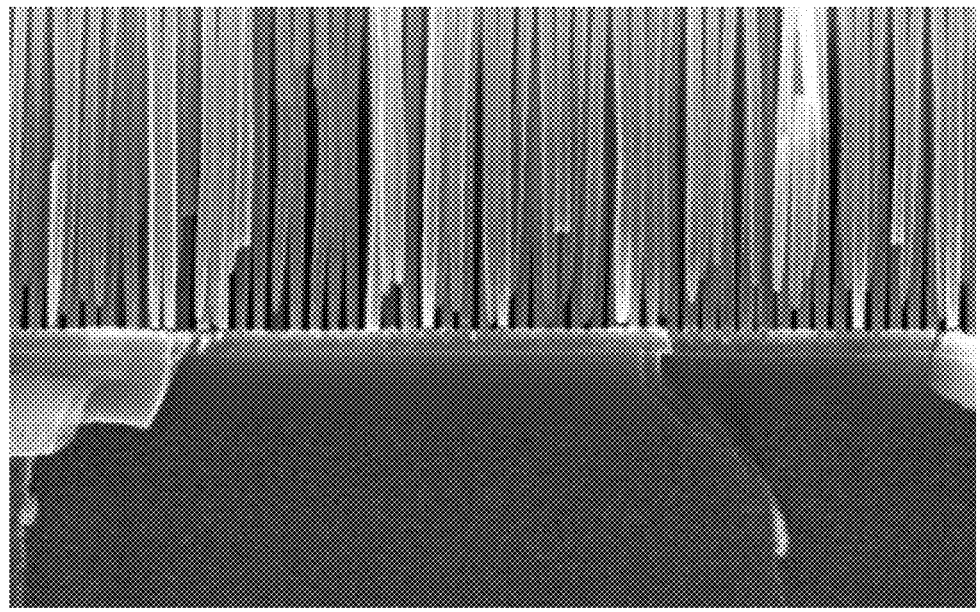
FIGS. 12A and 12B are SEMs showing a plurality of structures formed using conventional methods, as described in Example 4.
Figure 12B:
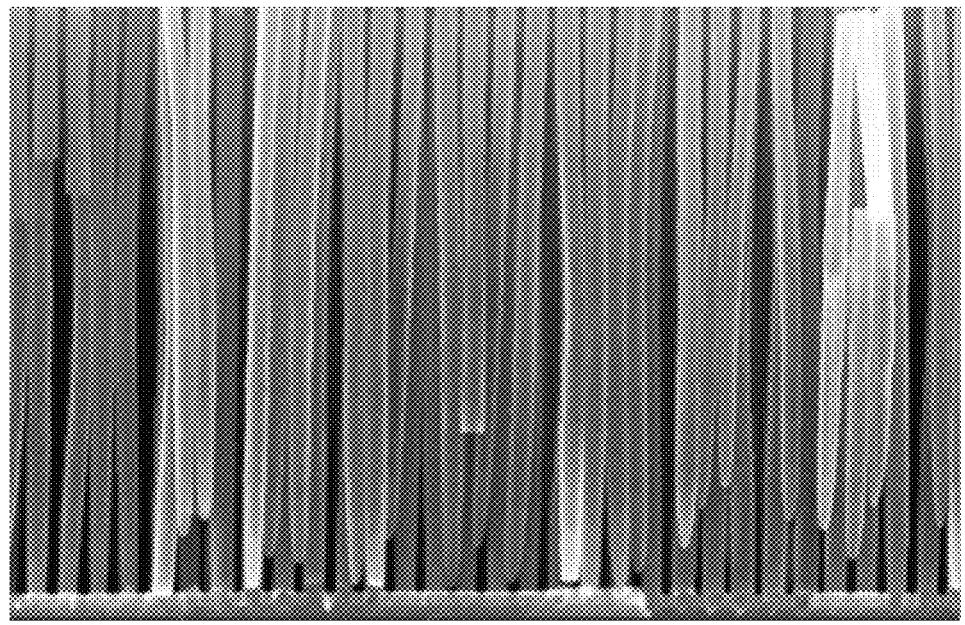

The plurality of container-shaped TiN structures of the first structure were processed using the following sequence: exposure to aqueous hydrofluoric acid (100:1) for two minutes, exposure to TMAH at 80° C. for three minutes, exposure to aqueous hydrofluoric acid (100:1) for one minute at room temperature (about 20° C.), rinsing with deionized water at room temperature, rinsing with isopropanol at room temperature, and blow drying at room temperature using gaseous nitrogen ($N_2$). FIGS. 12A and 12B are SEMs taken at different locations along the first structure following the aforementioned processing sequence. As shown in FIGS. 12A and 12B, the plurality of container-shaped TiN structures of the first structure exhibited significant toppling and collapse.

Figure 13A:
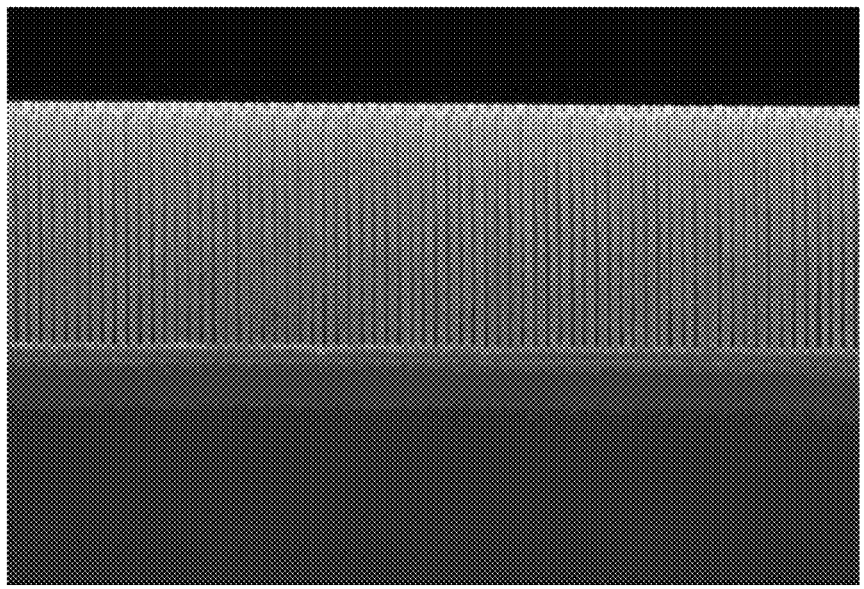
FIGS. 13A and 13B are SEMs showing a plurality of structures formed using an embodiment of the method of the disclosure, as described in Example 4.
Figure 13B:
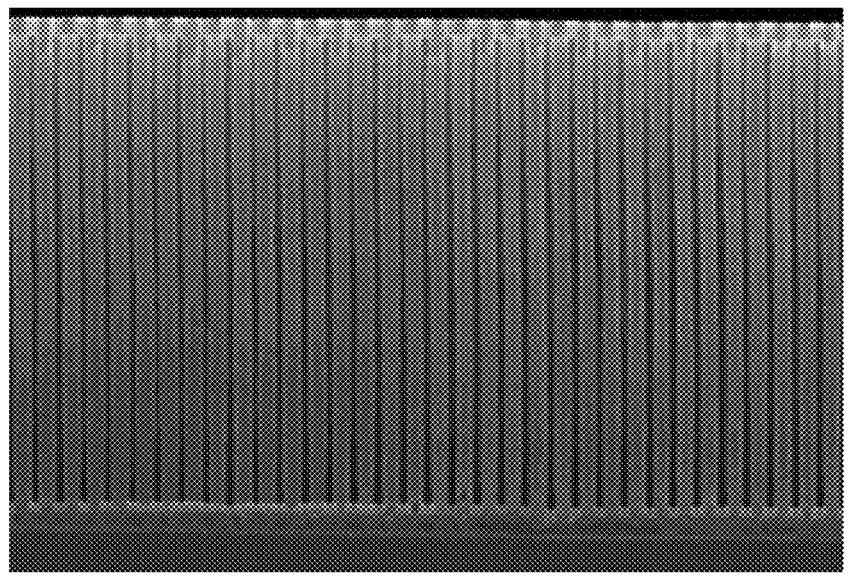

The plurality of container-shaped TiN structures of the second structure, which included a hydrophobic material formed from mono(n-octyl)phosphonic acid, were processed using the following sequence: exposure to aqueous hydrofluoric acid (100:1) for two minutes, exposure to TMAH at 80° C. for three minutes, exposure to aqueous hydrofluoric acid (100:1) for one minute at room temperature, rinsing with deionized water at room temperature, immersion in a 1 mM solution of mono(n-octyl)phosphonic acid in isopropanol at 50° C. for 10 minutes, rinsing with isopropanol at room temperature, and blow drying at room temperature using gaseous nitrogen ($N_2$). FIGS. 13A and 13B are SEMs taken at different locations along the second structure following the aforementioned processing sequence. As shown in FIGS. 13A and 13B, the plurality of container-shaped TiN structures of the second structure exhibited substantially reduced toppling and collapse as compared to the first structure.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:
1. A method of forming a hydrophobic surface on a semiconductor device structure, comprising:
forming a plurality of structures, each structure of the plurality of structures having at least one sidewall comprising titanium atoms, at least one opening between adjacent structures of the plurality of structures; and
contacting each of the plurality of structures with at least one of an organo-phosphonic acid and an organo-phosphoric acid to form a material having a hydrophobic surface on the at least one sidewall of each structure of the plurality of structures and extending from a retaining structure proximate an upper portion of each structure of the plurality of structures to a substrate underlying the plurality of structures, a majority of the at least one opening between the adjacent structures of the plurality of structures remaining following the formation of the material.

2. The method of claim 1, wherein contacting each of the plurality of structures with at least one of an organo-phosphonic acid and an organo-phosphoric acid comprises contacting the at least one sidewall of each of the plurality of structures with a plurality of organo-phosphonic acid compounds each comprising the following structure:

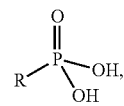

wherein R comprises a hydrocarbon group comprising at least one of an aliphatic group and a cyclic group.

3. The method of claim 2, wherein R comprises an alkyl group comprising from 6 carbon atoms to 18 carbon atoms.

4. The method of claim 2, wherein R comprises an aryl group comprising from 6 carbon atoms to 22 carbon atoms.

5. The method of claim 2, wherein contacting the at least one sidewall of each of the plurality of structures with a plurality of organo-phosphonic acid compounds comprises contacting the at least one sidewall of each of the plurality of structures with the plurality of organo-phosphonic acid compounds for a sufficient amount of time and at a sufficient temperature for a majority of the titanium atoms to bond with phosphonate groups of the plurality of organo-phosphonic acid compounds.

6. The method of claim 1, wherein contacting each of the plurality of structures with at least one of an organo-phosphonic acid and an organo-phosphoric acid comprises contacting the at least one sidewall of each of the plurality of structures with mono(n-octyl) phosphonic acid.

7. The method of claim 1, wherein contacting each of the plurality of structures with at least one of an organo-phosphonic acid and an organo-phosphoric acid comprises contacting the at least one sidewall of each of the plurality of structures with the at least one of the organo-phosphonic acid and the organo-phosphoric acid for a sufficient amount of time and at a sufficient temperature for the hydrophobic surface of the material to have a contact angle of greater than or equal to about 100 degrees.

8. The method of claim 1, wherein forming a plurality of structures, each structure of the plurality of structures having at least one sidewall comprising titanium atoms comprises forming each structure of the plurality of structures to comprise elemental titanium, titanium nitride, titanium carbide, a titanium silicide, a titanium oxide, or a titanium alloy.

9. The method of claim 1, wherein contacting each of the plurality of structures with at least one of an organo-phosphonic acid and an organo-phosphoric acid comprises immersing each of the plurality of structures in a solution comprising at least one solvent and the at least one of the organo-phosphonic acid and the organo-phosphoric acid.

10. The method of claim 9, wherein a concentration of the at least one of the organo-phosphonic acid and the organo-phosphoric acid in the solution is within a range of from about 1 milliMolar (mM) to about 10 mM.

11. The method of claim 1, wherein contacting each of the plurality of structures with at least one of an organo-phosphonic acid and an organo-phosphoric acid comprises contacting each of the plurality of structures with a gas comprising the at least one of the organo-phosphonic acid and the organo-phosphoric acid.

12. A method of forming a semiconductor device structure, comprising:
    forming adjacent structures comprising exposed titanium atoms; and
    forming a hydrophobic material extending over an outer sidewall of each of the adjacent structures from a retaining structure proximate an upper portion of each of the adjacent structures to a surface of a substrate underlying each of the adjacent structures, the hydrophobic material comprising a plurality of hydrophobic compounds on each of the adjacent structures, each of the plurality of hydrophobic compounds having a phosphate group bonded to an exposed titanium atom of the adjacent structures, the hydrophobic material comprising an exposed surface exhibiting a contact angle of greater than or equal to about 100 degrees.

13. The method of claim 12, wherein forming adjacent structures comprises forming the adjacent structures to each have an aspect ratio within a range of from about 10:1 to about 50:1.

14. The method of claim 12, wherein forming adjacent structures comprises forming the adjacent structures to have a distance between the adjacent structures of less than or equal to about 600 Angstroms.

15. The method of claim 12, wherein forming adjacent structures comprises forming the adjacent structures to each have a height of greater than or equal to about $1.0 \times 10^4$ Angstroms and a diameter of less than or equal to about 650 Angstroms.

16. The method of claim 12, wherein forming adjacent structures comprises forming each of the adjacent structures as a container-shaped structure.

17. The method of claim 12, wherein forming a hydrophobic material comprises forming the hydrophobic material to a thickness within a range of from about 10 Angstroms to about 25 Angstroms.

18. The method of claim 12, wherein forming a hydrophobic material comprises adsorbing a plurality of precursor compounds to the exposed titanium atoms of the adjacent structures, each of the plurality of precursor compounds comprising a phosphonate group bonded to a hydrocarbon group.

19. The method of claim 12, further comprising removing the hydrophobic material.

20. The method of claim 19, wherein removing the hydrophobic material comprises exposing the hydrophobic material to a temperature greater than or equal to a thermal desorption temperature of the hydrophobic material.

21. The method of claim 19, wherein removing the hydrophobic material comprises exposing the hydrophobic material to at least one of high energy radiation, ozone, plasma, reactive ions, and an oxidizing agent.

22. The method of claim 19, further comprising:
    forming a dielectric material over surfaces of the substrate and the adjacent structures; and
    forming a conductive material over surfaces of the dielectric material.

23. The method of claim 12, wherein forming a hydrophobic material extending over an outer sidewall of each of the adjacent structures from a retaining structure proximate an upper portion of the each of the adjacent structures to a surface of a substrate underlying each of the adjacent structures comprises maintaining a majority of an opening between the hydrophobic material on the adjacent structures.

24. A semiconductor device structure, comprising:
    a plurality of structures, each structure of the plurality of structures comprising titanium;
    a hydrophobic material overlying outer sidewalls of the plurality of structures and extending from a retaining structure proximate an upper portion of each of the plurality of structures to a substrate underlying each of the plurality of structures, the hydrophobic material comprising a plurality of hydrophobic compounds, each of the hydrophobic compounds comprising:
        a polar head group bonded to a titanium atom of one of the plurality of structures; and
        a hydrophobic tail group bonded to the polar head group and comprising a hydrocarbon group; and
    at least one opening between the hydrophobic material overlying adjacent structures of the plurality of structures.

25. The semiconductor device structure of claim 24, wherein each of the plurality of structures comprises a plurality of isolated structures.

26. The semiconductor device structure of claim 24, wherein the polar head groups comprise a phosphonate group or a phosphate group.

27. The semiconductor device structure of claim 24, wherein each of the plurality of structures comprises titanium nitride.

* * * * *